United States Patent
Uriu et al.

(10) Patent No.: US 8,132,140 B2
(45) Date of Patent: Mar. 6, 2012

(54) ANALYZING DEVICE FOR CIRCUIT DEVICE, CIRCUIT DEVICE ANALYZING METHOD, ANALYZING PROGRAM, AND ELECTRONIC MEDIUM

(75) Inventors: Kazuhide Uriu, Osaka (JP); Toru Yamada, Osaka (JP); Masahiro Yamaoka, Osaka (JP)

(73) Assignee: Panasonic Corporation, Osaka (JP)

( * ) Notice: Subject to any disclaimer, the term of this patent is extended or adjusted under 35 U.S.C. 154(b) by 399 days.

(21) Appl. No.: 12/374,353

(22) PCT Filed: Dec. 27, 2007

(86) PCT No.: PCT/JP2007/075215
§ 371 (c)(1),
(2), (4) Date: Jan. 19, 2009

(87) PCT Pub. No.: WO2008/087849
PCT Pub. Date: Jul. 24, 2008

(65) Prior Publication Data
US 2009/0249264 A1    Oct. 1, 2009

(30) Foreign Application Priority Data

Jan. 15, 2007   (JP) ................. 2007-005609
Jan. 15, 2007   (JP) ................. 2007-005610

(51) Int. Cl.
*G06F 17/50*   (2006.01)

(52) U.S. Cl. ........ 716/124; 716/105; 716/125; 716/131; 703/16

(58) Field of Classification Search .............. 716/105, 716/124, 125, 131; 703/16
See application file for complete search history.

(56) References Cited

U.S. PATENT DOCUMENTS 5,309,371 A * 5/1994 Shikata et al. ............ 716/121
(Continued)

FOREIGN PATENT DOCUMENTS

EP   0 845 746 A2   6/1998
(Continued)

OTHER PUBLICATIONS

International Search Report for PCT/JP2007/075215, Feb. 26, 2008

*Primary Examiner* — Phallaka Kik
(74) *Attorney, Agent, or Firm* — Pearne & Gordon LLP

(57) ABSTRACT

A circuit board analyzing method and a circuit board analyzer are provided which can greatly reduce analyzing time. The circuit board analyzer includes a computing unit 110, a memory unit 140 connected to the computing unit 110, and an input unit 160 connected to the computing unit 110. The computing unit 110 includes a wiring data acquiring section 310 acquiring data of wirings formed on a circuit board, a basic circuit diagram forming section 320 dividing the wirings into meshes and setting cells and branches connecting the adjacent cells, and an interference analysis setting section 330 setting an element ignoring range of elements set in the cells and the branches.

31 Claims, 15 Drawing Sheets

U.S. PATENT DOCUMENTS

| | | | | |
|---|---|---|---|---|
| 5,640,327 | A * | 6/1997 | Ting | 716/121 |
| 6,317,859 | B1 * | 11/2001 | Papadopoulou | 716/135 |
| 6,480,992 | B1 * | 11/2002 | Runyon | 716/122 |
| 6,505,325 | B1 * | 1/2003 | Hamamoto | 716/52 |
| 6,865,725 | B2 * | 3/2005 | Dickey et al. | 716/111 |
| 7,350,175 | B2 | 3/2008 | Iwaki et al. | |
| 7,356,791 | B2 * | 4/2008 | Rautio | 716/111 |
| 7,373,628 | B1 * | 5/2008 | Balsdon et al. | 716/129 |
| 7,530,040 | B1 * | 5/2009 | Balsdon et al. | 716/129 |
| 7,784,010 | B1 * | 8/2010 | Balsdon et al. | 716/118 |
| 2004/0216063 | A1 * | 10/2004 | Dickey et al. | 716/7 |
| 2005/0172253 | A1 * | 8/2005 | Osanai | 716/10 |
| 2006/0271891 | A1 * | 11/2006 | Rautio | 716/5 |
| 2008/0028352 | A1 * | 1/2008 | Birch et al. | 716/12 |

FOREIGN PATENT DOCUMENTS

| | | |
|---|---|---|
| JP | 10-214281 A | 8/1998 |
| JP | 2003-157296 A | 5/2003 |
| JP | 2006-127495 A1 | 5/2006 |
| WO | 2006-112411 A1 | 10/2006 |

* cited by examiner

FIG. 1
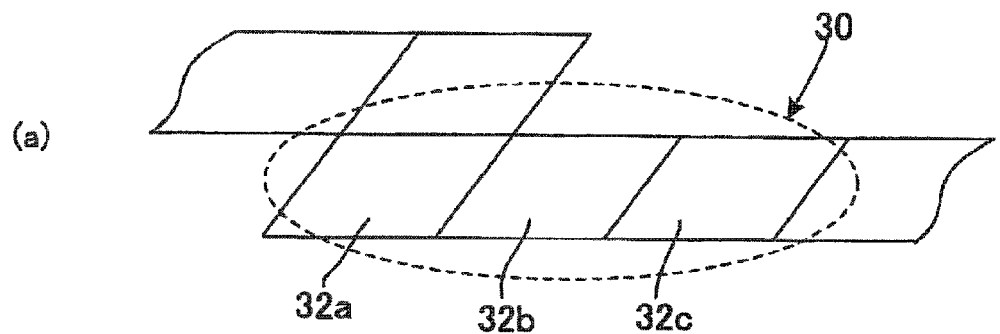
(a)
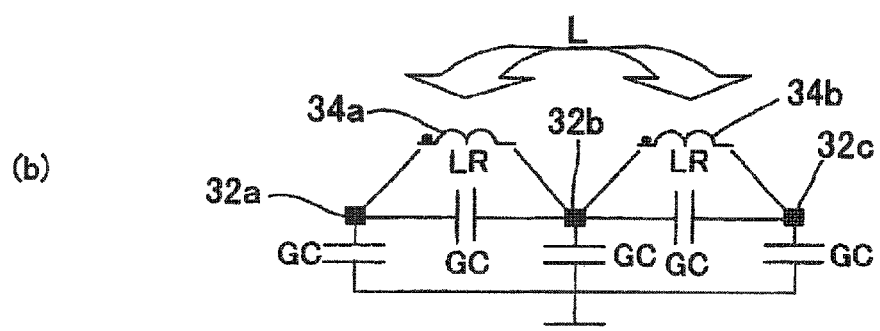
(b)
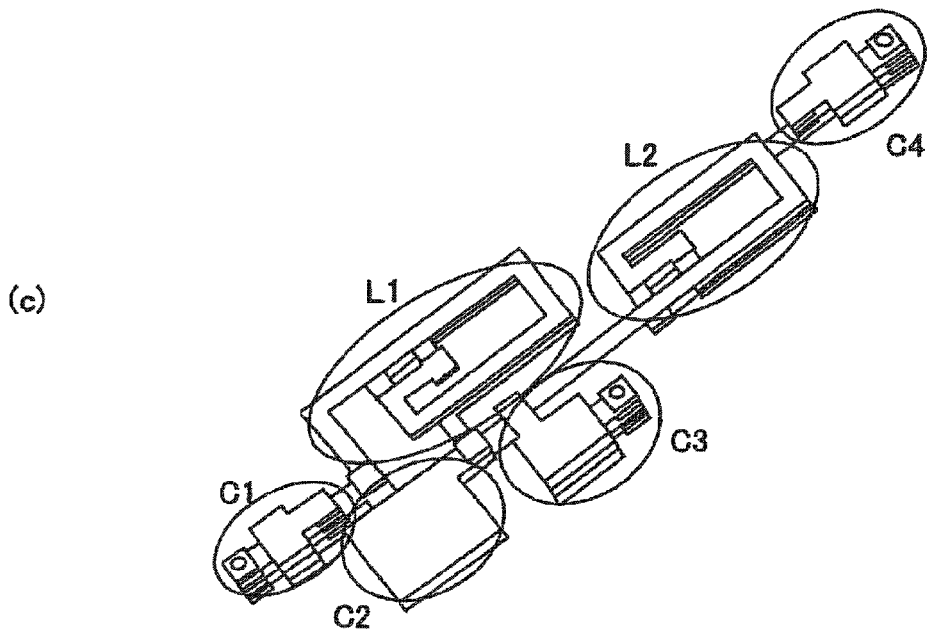
(c)

FIG. 5
(a)
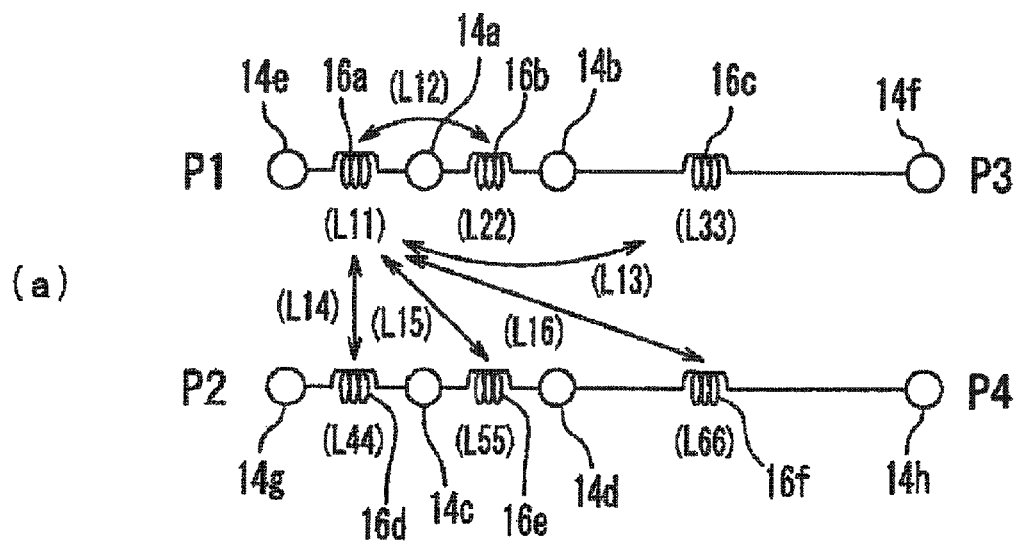
(b)
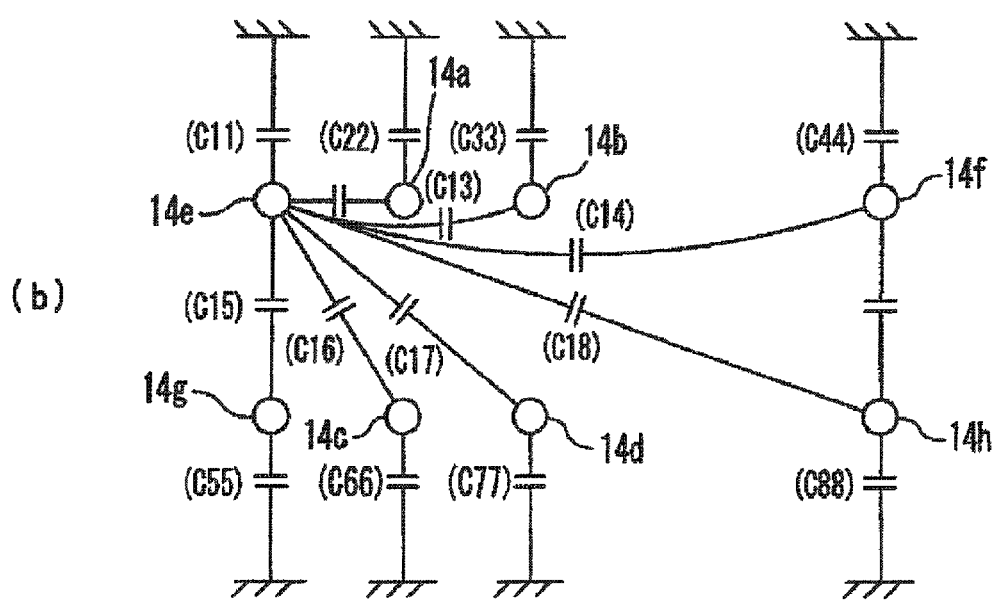

FIG. 6

$$\begin{Bmatrix} L11 & L12 & L13 & L14 & L15 & L16 \\ L21 & L22 & L23 & L24 & L25 & L26 \\ L31 & L32 & L33 & L34 & L35 & L36 \\ L41 & L42 & L43 & L44 & L45 & L46 \\ L51 & L52 & L53 & L54 & L55 & L56 \\ L61 & L62 & L63 & L64 & L65 & L66 \end{Bmatrix}$$

FIG. 7

(a)
$$\begin{pmatrix} C11 & C12 & C13 & C14 & C15 & C16 & C17 & C18 \\ C21 & C22 & C23 & C24 & C25 & C26 & C27 & C28 \\ C31 & C32 & C33 & C34 & C35 & C36 & C37 & C38 \\ C41 & C42 & C43 & C44 & C45 & C46 & C47 & C48 \\ C51 & C52 & C53 & C54 & C55 & C56 & C57 & C58 \\ C61 & C62 & C63 & C64 & C65 & C66 & C67 & C68 \\ C71 & C72 & C73 & C74 & C75 & C76 & C77 & C78 \\ C81 & C82 & C83 & C84 & C85 & C86 & C87 & C88 \end{pmatrix}$$

(b)
$$\begin{pmatrix} C11 & C12 & 0 & 0 & 0 & C16 & 0 & 0 \\ C21 & C22 & C23 & 0 & 0 & C26 & C27 & 0 \\ 0 & C32 & C33 & C34 & 0 & C36 & C37 & 0 \\ 0 & 0 & C43 & C44 & 0 & 0 & C47 & 0 \\ 0 & 0 & 0 & 0 & C55 & C56 & 0 & 0 \\ C61 & C62 & C63 & 0 & C65 & C66 & C67 & 0 \\ 0 & C72 & C73 & C74 & 0 & C76 & C77 & C78 \\ 0 & 0 & 0 & 0 & 0 & 0 & C87 & C88 \end{pmatrix}$$

(c)
$$\begin{pmatrix} 0.1 & 0.2 & 0 & 0 & 0 & 0.1 & 0 & 0 \\ 0.2 & 1 & 0.7 & 0 & 0 & 0.8 & 0.05 & 0 \\ 0 & 0.4 & 1 & 0.8 & 0 & 0.6 & 0.1 & 0 \\ 0 & 0 & 0.6 & 0.3 & 0 & 0 & 0.2 & 0 \\ 0 & 0 & 0 & 0 & 0.2 & 0.3 & 0 & 0 \\ 0.2 & 0.6 & 0.7 & 0 & 0.9 & 1 & 0.4 & 0 \\ 0 & 0.05 & 0.1 & 0.3 & 0 & 0.4 & 0.5 & 0.9 \\ 0 & 0 & 0 & 0 & 0 & 0 & 1 & 0.1 \end{pmatrix}$$

(d)
$$\begin{pmatrix} 0 & 0 & 0 & 0 & 0 & 0 & 0 & 0 \\ 0 & 1 & 0.7 & 0 & 0 & 0.8 & 0 & 0 \\ 0 & 0.4 & 1 & 0.8 & 0 & 0.6 & 0 & 0 \\ 0 & 0 & 0.6 & 0.3 & 0 & 0 & 0 & 0 \\ 0 & 0 & 0 & 0 & 0 & 0.3 & 0 & 0 \\ 0 & 0.6 & 0.7 & 0 & 0.9 & 1 & 0.4 & 0 \\ 0 & 0 & 0 & 0.3 & 0 & 0.4 & 0.5 & 0.9 \\ 0 & 0 & 0 & 0 & 0 & 0 & 1 & 0 \end{pmatrix}$$

FIG. 13
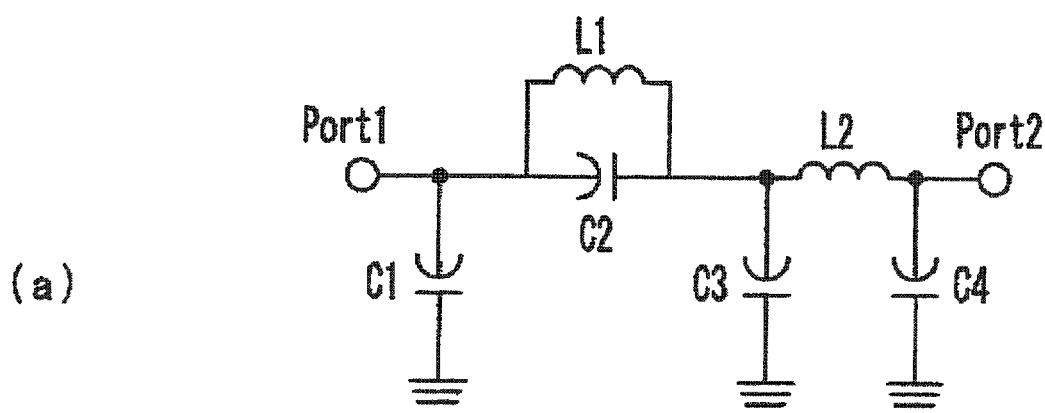
(a)
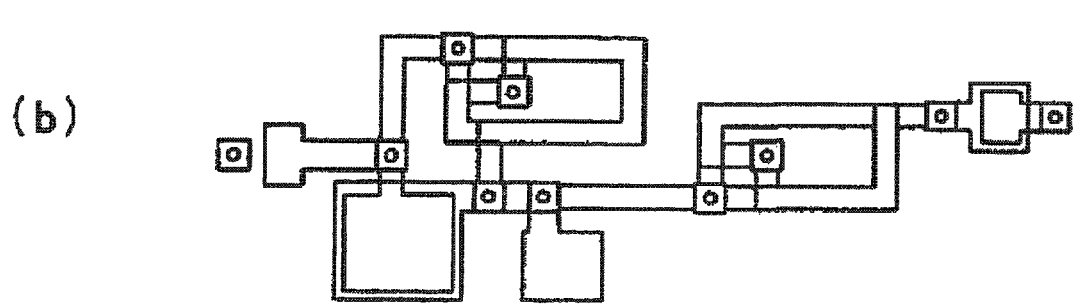
(b)

FIG. 17
(a)
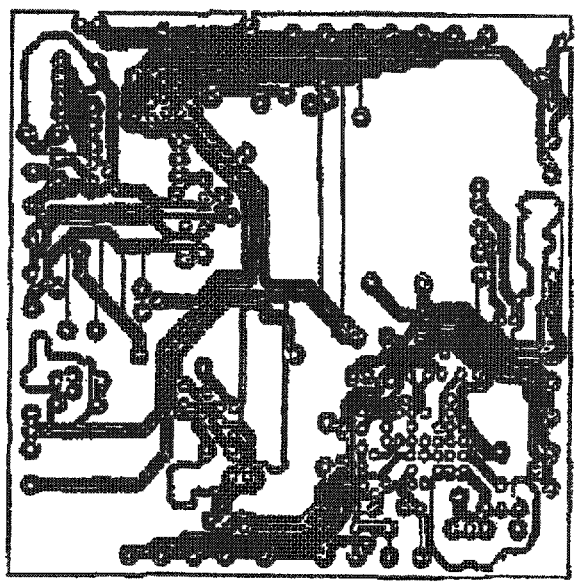
(b)
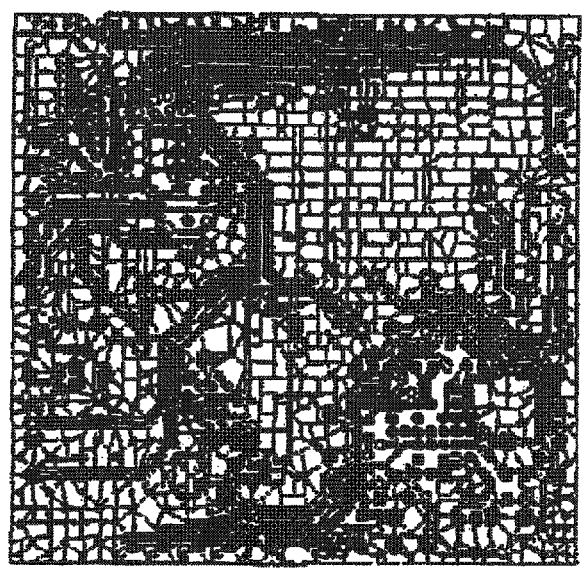

ANALYZING DEVICE FOR CIRCUIT DEVICE, CIRCUIT DEVICE ANALYZING METHOD, ANALYZING PROGRAM, AND ELECTRONIC MEDIUM

TECHNICAL FIELD

The present invention relates to an analyzing device for a circuit device, a circuit device analyzing method, an analyzing program, and an electronic medium, and more particularly, to a method of analyzing an electromagnetic field of a circuit device used in various electronic apparatuses.

BACKGROUND ART

The design of a printed circuit board (wiring board) is often carried out by the use of a printed circuit board CAD (Computer Aided Design) device using a computer (for example, Patent Document 1). Many portions of the design of a printed circuit board using a CAD device are automated, but the appropriate design thereof can often be carried out by only an expert designer.

In design of a printed circuit board of a high-frequency circuit, inter-wiring interference often has a great influence on a transmission characteristic. However, to compute the amount of inter-wiring interference, it is required to calculate characteristics of the wirings using complex computations based on the electromagnetic field analysis. Accordingly, unlike the analysis of a simple textbook wiring model, it is often difficult to consider the amount of inter-wiring interference in actually designing complex wirings. It is often impossible to make the computation within the finite operating time.

Therefore, the consideration of the amount of inter-wiring interference often depends on an expert designer's sense, not the electromagnetic field analysis, or often depends on trial and error without considering the amount of inter-wiring interference.

Patent Document 1: JP-A-10-214281

DISCLOSURE OF THE INVENTION

Problem That The Invention Is To Solve

When the amount of inter-wiring interference is calculated by the electromagnetic field analysis and the wiring to be analyzed is, for example, a wiring pattern 1000 (that is, a complex wiring pattern actually used) shown in FIG. 17(*a*), the electromagnetic field analysis cannot be performed without any change. Accordingly, the overall wiring pattern 1000 is divided into mesh shapes ("2000") as shown in FIG. 17(*b*), an analysis model in the divided cells is analyzed in electromagnetic field, and interactions between the individual cells are computed. In this way, the electromagnetic field analysis is completed. The amount of inter-wiring interference is calculated from the overall result of the electromagnetic field analysis.

However, in the wiring pattern 1000 (a wiring pattern in one layer of a multi-layered board in this example) having a complex structure shown in FIG. 17(*a*), the division number increases as shown in FIG. 17(*b*) and thus the computing time increases. Accordingly, a case where the electromagnetic field analysis is not completed within the realistic operating time may occur often or the analysis may not be completed at all in the today most-advanced wiring board.

The inventor predicted the following result, when the wiring board to be analyzed is a multi-layered board with eight layers having a board size of 40 mm×40 mm, the number of nets (the number of wirings connecting parts) is 550, and the number of bias electrically connecting the layers is 5000. That is, when the electromagnetic field analysis is performed by a moment method using the 3 GHz Pentium (registered trademark) 4 processor as the CPU and a 2 Gbyte memory and the frequency point is set to 20 points, it was guessed that the physical memory required for the structure to be analyzed exceeds the memory capacity of the computer and thus the analysis is impossible. Even when the restriction of the memory capacity is cleared, it was predicted that at least 500 hours are required for the analysis.

As the frequency point increases, it is natural that the processing time or the amount of processed data also increases. In addition, since the electromagnetic field analysis is not ended once but should be performed every improvement of the wiring board, it takes much time to actually calculate the amount of inter-wiring interference by the electromagnetic field analysis, even not considering a wiring board having a very simple structure. In some cases, the analysis may not be completed within the finite time.

On the other hand, when the frequency point is reduced or the division size of meshes is enhanced, the analyzing time can be reduced to forcibly perform the electromagnetic field analysis. However, the precision in amount of the inter-wiring interference acquired from the result of the electromagnetic field analysis may be deteriorated, thereby not satisfactorily obtaining the necessary precision.

In this way, the analyzing time is not sufficient when it is intended to perform a high-precision electromagnetic field analysis at the realistic usable level, and the analysis precision is sacrificed and the necessary precision is not obtained when it is intended to roughly perform the electromagnetic field analysis to enhance the analysis speed. Accordingly, it is very difficult to balance the analysis speed and the analysis precision.

This problem is true in a layout or wiring of elements of a semiconductor integrated circuit (LSI), as well as the analysis of the printed circuit board. Accordingly, it is very difficult to improve both the analysis speed and the analysis precision.

The invention is contrived in view of the above-mentioned situations. An advantage of the invention is to provide an electromagnetic field analyzing method of a circuit device, which can greatly reduce the analyzing time while maintaining the necessary analysis precision.

Means For Solving The Problem

According to an aspect of the invention, there is provided an analyzing device for a circuit device including: a computing unit which computes a coupling state between elements of the circuit device; a memory unit connected to the computing unit; and an input unit connected to the computing unit. Here, the computing unit includes a division section dividing the circuit device into a plurality of areas on the basis of layout data of the circuit device, and a coupling ignoring section performing a setting operation of ignoring a coupling between the areas divided by the division section.

In the analyzing device, the computing unit may include a coupling specifying section (a) specifying a coupling occurrence position in the layout of the circuit device, and a coupling ignoring section (b) performing the setting operation of ignoring the coupling in the coupling occurrence position.

In the analyzing device, the division section may divide a wiring area of the circuit device into meshes and give a determinant to the meshes to form a determinant, and the coupling ignoring section (b) may replace at least a part of off-diagonal elements of the determinant with 0.

In the analyzing device, the coupling ignoring section (b) may have a function of setting a coupling ignoring range on the basis of the minimum distance.

In the analyzing device, the coupling specifying section (a) may have a function of displaying mutual inductance and capacitance as circuit constants at a layout level.

In the analyzing device, the memory unit may store layout data based on the layout of the circuit device.

In the analyzing device, the coupling specifying section (a) may have a function of forming an equivalent circuit model on the basis of the layout of the circuit device.

In the analyzing device, the computing unit may include a wiring data acquiring section (a) acquiring data of wirings formed in the circuit device, a basic circuit diagram forming section (b) dividing the wirings into meshes and setting cells and branches connecting the adjacent cells, and an interference analysis setting section (c) setting an element ignoring range of elements set in the cells, between the cells, in the branches, and between the branches.

In the analyzing device, the computing unit may further include an element ignoring section (d) ignoring the elements on the basis of the setting of the element ignoring range, and a circuit constant deriving section (e) deriving element values corresponding to circuit constants of the elements set in the cells, between the cells, in the branches, and between the branches.

In the analyzing device, the basic circuit diagram forming section (b) may have, as the elements, a function of setting serial resistance and inductance in the branches, a function of setting mutual inductance between the branches, a function of setting capacitance and conductance in the cells with respect to a ground, and a function of setting capacitance and conductance between the cells.

In the analyzing device, the interference analysis setting section (c) may set the element ignoring range on the basis of distances between the cells.

In the analyzing device, the interference analysis setting section (c) may set the element ignoring range on the basis of values of the elements set between the cells and between the branches.

In the analyzing device, the interference analysis setting section (c) may set the element ignoring range on the basis of values of the elements set in the cells and the branches.

In the analyzing device, the element ignoring section (d) may perform the coupling ignoring operation by replacing some numerical values of a determinant with 0.

In the analyzing device, the cells may include ports for inputting and outputting an external signal.

In the analyzing device, the interference analysis setting section (c) may set the range in response to the input from the input unit.

In the analyzing device, the interference analysis setting section (c) may have a probing function of selecting as an analysis target area at least a part of an area including the wirings of the circuit device.

In the analyzing device, a circuit analyzing section computing a circuit matrix using the element values derived by the circuit constant deriving section (d) may be provided.

In the analyzing device, the circuit matrix may be an S matrix.

According to another aspect of the invention, there is provided a circuit device analyzing method of analyzing a layout of a circuit device using an analyzing device including a computing unit computing a coupling state between elements of the circuit device and having a division section dividing the circuit device into a plurality of areas in layout data of the circuit device and a coupling ignoring section performing a setting operation of ignoring a coupling between the areas divided by the division section, a memory unit connected to the computing unit, and an input unit connected to the computing unit, the method including: a coupling specifying step of specifying a coupling occurrence position in a layout of the circuit device by the computing unit; and a coupling ignoring step of performing a setting operation of ignoring the coupling in the coupling occurrence position.

In the circuit device analyzing method, the computing unit may be connected to the input unit, and a coupling ignoring range is set in response to the input from the input unit in the coupling ignoring step.

The circuit device analyzing method of analyzing a wiring layout of the circuit device may include a wiring data acquiring step of acquiring data of the wirings formed in the circuit device, a basic circuit diagram forming step of dividing the wirings into meshes and setting cells and branches connecting the adjacent cells, an interference analysis setting step of setting an element ignoring range of elements set in the cells, between the cells, in the branches, and between the branches, a first element ignoring step of ignoring the elements on the basis of the setting of the element ignoring range, and a circuit constant deriving step of deriving element values corresponding to circuit constants of the elements set in the cells, between the cells, in the branches, and between the branches.

In the circuit device analyzing method, the wiring data acquiring step may include a step of acquiring the layout data from the memory unit storing the layout data based on the layout of the circuit device.

In the circuit device analyzing method, the interference analysis setting step may include a step of selecting as an analysis target area a part of an area including the wirings of the circuit device.

In the circuit device analyzing method, the element ignoring range may be set on the basis of at least one of the minimum distance and a coupling element value.

In the circuit device analyzing method, the first element ignoring step may include a step of determining whether the distance between the cells is in the element ignoring range.

The circuit device analyzing method may further include a second element ignoring step of performing an element ignoring operation on the basis of the setting of the element ignoring range, after the circuit constant deriving step is conducted.

In the circuit device analyzing method, the second element ignoring step may include a step of determining whether the element value derived in the circuit constant deriving step is in the element ignoring range.

The circuit device analyzing method may further include a step of storing the element value derived in the circuit constant deriving step in the memory unit.

The circuit device analyzing method may further include a circuit analyzing step of computing a circuit matrix using the element values, after the second element ignoring step is conducted.

According to another aspect of the invention, there is provided a circuit device designing method including the steps for performing the circuit device analyzing method.

According to still another aspect of the invention, there is provided an analyzing program for analyzing a wiring layout of a circuit device using the analyzing device, the program causing the computing unit to execute: a coupling specifying function of specifying a coupling occurrence position in a layout of the circuit device; and a coupling ignoring function of performing a setting operation of ignoring a coupling in the coupling occurrence position.

The circuit device analyzing program for analyzing a wiring layout of a circuit device may cause the computing unit to further execute: a wiring data acquiring function of acquiring data, which is stored in the memory unit, of the wirings formed in the circuit device; a basic circuit diagram forming function of dividing the wirings into meshes and setting cells and branches connecting the adjacent cells; an interference analysis setting function of setting an element ignoring range of elements set in the cells, between the cells, in the branches, and between the branches; an element ignoring function of ignoring the elements on the basis of the setting of the element ignoring range; and a circuit constant deriving function of deriving element values corresponding to circuit constants of the elements set in the cells, between the cells, in the branches, and between the branches.

According to another aspect of the invention, there is provided a storage medium storing the analyzing program.

The circuit device in the invention includes a semiconductor integrated circuit device such as a semiconductor integrated circuit (LSI), as well as a circuit board such as a printed circuit board.

Advantages Of The Invention

In the circuit board analyzing method according to the invention, the layout of the wirings formed in the circuit device is acquired, the wirings are divided into meshes, the cells and the branches connecting the adjacent cells are set, the element ignoring range is set for the elements set in the cells, between the cells, in the branches, and between the branches, and the element values corresponding to the circuit constants of the elements set in the cells, between the cells, in the branches, and between the branches are derived by performing an analyzing process. That is, the analyzing process is performed after the elements having a small influence on the inter-wiring interference are ignored in advance from the set elements. Accordingly, it is possible to perform a computing operation without considering the elements having a small influence on the interference in advance and thus to embody a high-speed analyzing process while maintaining a certain degree of analysis precision. As a result, it is possible to perform an analysis of a complex wiring pattern or a large-scale analysis which could not be coped with by the typical electromagnetic field analysis. Since the processing time can be greatly reduced, it is possible to facilitate the feedback to the design of the circuit device and thus to optimize the layout of the circuit device.

BRIEF DESCRIPTION OF THE DRAWINGS

FIG. 1(a) is a plan view illustrating a wiring pattern 30 divided in a mesh shape, FIG. 1(b) is a diagram illustrating an example of an equivalent circuit model including cells and branches, and FIG. 1(c) is a perspective view of the wiring pattern on a circuit board.

FIG. 5 is a diagram illustrating an equivalent circuit model of the wiring layout shown in FIG. 4(b), where FIG. 5(a) is a diagram illustrating coupling of elements L and FIG. 5(b) is a diagram illustrating coupling of elements C.

FIG. 6 is a diagram illustrating an example of a determinant having a group of elements L.

FIGS. 7(a) to 7(d) are diagrams illustrating an example of a determinant having a group of elements C, where FIG. 7(a) is a diagram illustrating a determinant after the cells and the branches are set, FIG. 7(b) is a diagram illustrating the determinant after a coupling ignoring operation using a distance is performed, FIG. 7(c) is a diagram illustrating the determinant after element values are derived, and FIG. 7(d) is a diagram illustrating the determinant after the coupling ignoring operation using the element values is performed.

FIG. 13(a) is a circuit diagram illustrating ideal circuit elements of a low-pass filter and FIG. 13(b) is a diagram illustrating an example of a wiring layout formed on the basis of the circuit diagram.

FIG. 17(a) is a plan view illustrating a wiring pattern 1000 of an inner layer of a multi-layered board and FIG. 17(b) is a plan view illustrating a wiring pattern 2000 obtained by dividing the wiring pattern in a mesh shape.

DESCRIPTION OF REFERENCE NUMERALS AND SIGNS

Figure 2:
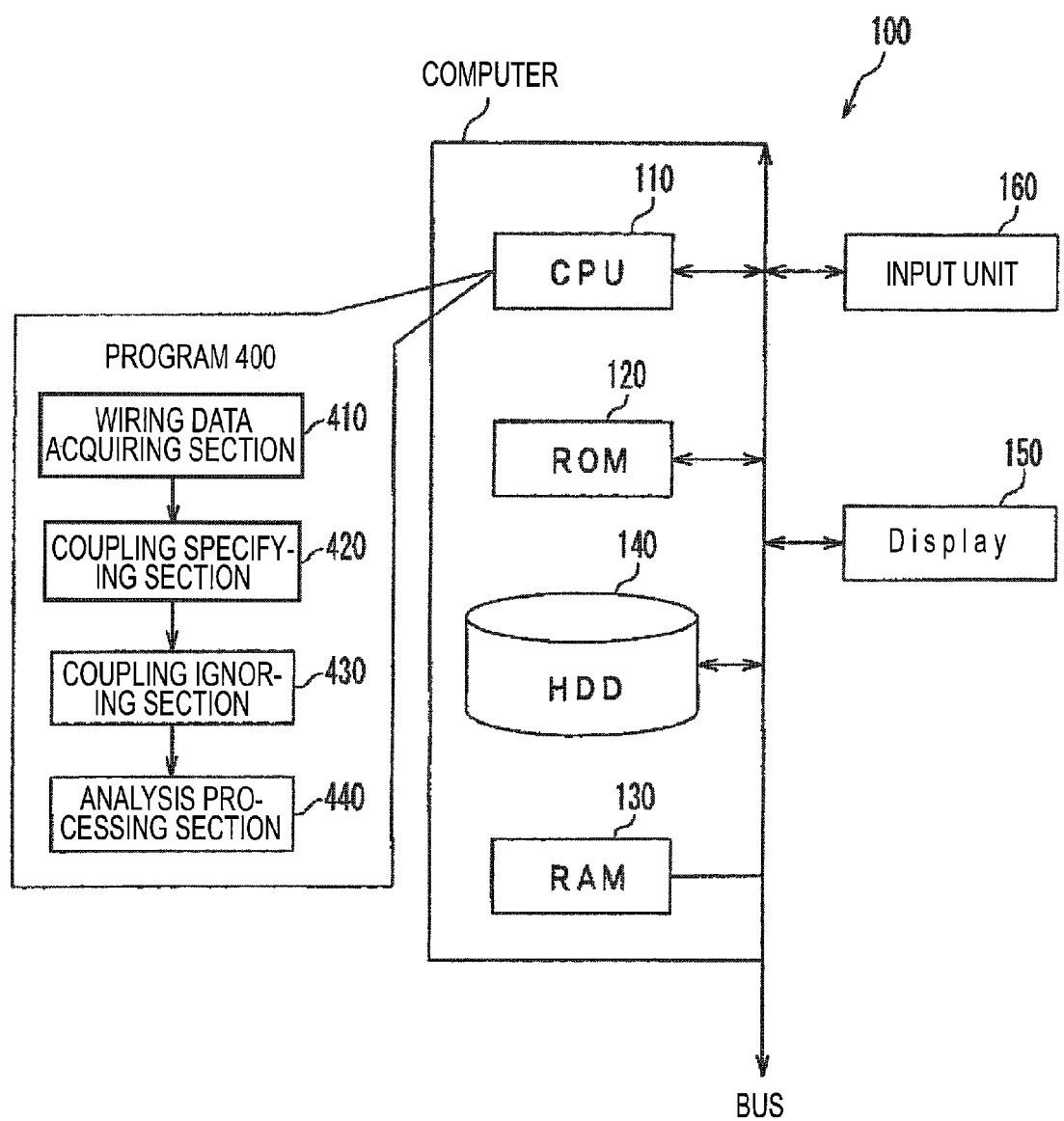
FIG. 2 is a diagram illustrating a configuration of a circuit board analyzer according to an embodiment of the invention.

12: WIRING
14: CELL
16: BRANCH
30: WIRING PATTERN
32: CELL
34: BRANCH
100: COMPUTER
110: COMPUTING UNIT
120: ROM
130: RAM
140: HDD
150: DISPLAY
160: INPUT UNIT
170: INTERFERENCE ANALYZING PROGRAM
200: WIRING DATA
210: BOARD DATA
220: LAYOUT DATA
230: COMPONENT DATA
300: INTERFERENCE ANALYZING PROGRAM
310: WIRING DATA ACQUIRING SECTION
320: BASIC CIRCUIT DIAGRAM FORMING SECTION

330: INTERFERENCE ANALYSIS SETTING SECTION
340: COUPLING IGNORING SECTION
350: CIRCUIT CONSTANT DERIVING SECTION
360: CIRCUIT CONSTANT OUTPUT SECTION
400: IDEAL EQUIVALENT CIRCUIT OF ANTENNA SWITCH MODULE
500: MULTI-LAYERED BOARD

BEST MODE FOR CARRYING OUT THE INVENTION

Hereinafter, embodiments of the invention will be described with reference to the accompanying drawings. In the following drawings, elements having substantially like functions are referenced by like reference numerals for the purpose of brief explanation. The invention is not limited to the following embodiments.

The inventor knew that the processing time is great as the result of verification of inter-wiring interference in a complex wiring pattern using an electromagnetic field analysis, but it is possible to make a computation in selective consideration of coupling elements (such as parasitic capacitor C) greatly contributing to the inter-wiring interference and thus to greatly reduce the analyzing time without damaging the analysis precision, when interactions (coupling occurrence positions) between individual cells can be specified in advance before performing the electromagnetic field analysis. The invention is based on the knowledge. Hereinafter, the knowledge will be further described.

In the method using the typical electromagnetic field analysis, as shown in FIG. 17(b), a wiring is divided in a mesh shape and the electromagnetic field analysis is performed on the basis of all the divided pieces (cells), thereby requiring great processing time.

On the other hand, in embodiments of the invention, a wiring 30 is divided in a mesh shape to form cells 32 (such as 32a, 32b, and 32c) as shown in FIG. 1(a) and then is replaced with an equivalent circuit model including cells 32 and branches 34 in which predetermined elements (RLGC) as shown in FIG. 1(b). FIG. 1(c) is an example of a perspective view of a wiring pattern. L1 and L2 indicate inductance (L element) and C1 to C4 indicate capacitance (C element).

Then, elements having a small influence on the inter-wiring interference are ignored on the basis of the equivalent circuit model and then an analyzing process of deriving element values corresponding to circuit constants of the elements is performed. The details of the equivalent circuit model will be described later.

Hereinafter, embodiments of the invention will be described with reference to the accompanying drawings. In the following drawings, elements having substantially like functions are referenced by like reference numerals for the purpose of brief explanation. The invention is not limited to the following embodiments.

A circuit board analyzer according to an embodiment of the invention will be described now with reference to FIG. 2. FIG. 2 is a block diagram schematically illustrating a configuration of a circuit board analyzer 100 according to an embodiment of the invention. The circuit board analyzer 100 includes a CPU (computing unit) 110 performing a computing operation, a memory unit connected to the CPU 110, and an input unit 160 connected to the CPU 110.

The memory unit connected to the CPU 110 includes a ROM 120 storing programs and the like, a RAM 130 serving as a work area of the CPU, and an HDD 140 storing various setting data. The input unit 160 is a device such as a keyboard and a mouse receiving an operator's input. The programs are not limited to the ROM 120, but may be stored in the HDD 140 or the RAM 130.

The CPU 110 executes the programs stored in the ROM 120 or the HDD 140 using the RAM 130 as a work area. The CPU 110 according to this embodiment can perform the steps shown in FIG. 3 by the use of, for example, the program 400 stored in the ROM 120. That is, by combination of the CPU 110 and the program 400 stored in the ROM 120, a wiring data acquiring section 410 acquiring data of wirings formed on the circuit board, a coupling specifying section 420 specifying a coupling occurrence position in the layout of the circuit board, a coupling ignoring section 430 performing a setting operation of ignoring a coupling during occurrence of the coupling, and an analyzing section 440 performing an analysis process (for example, electromagnetic field analysis using a moment method) are embodied.

Figure 3:
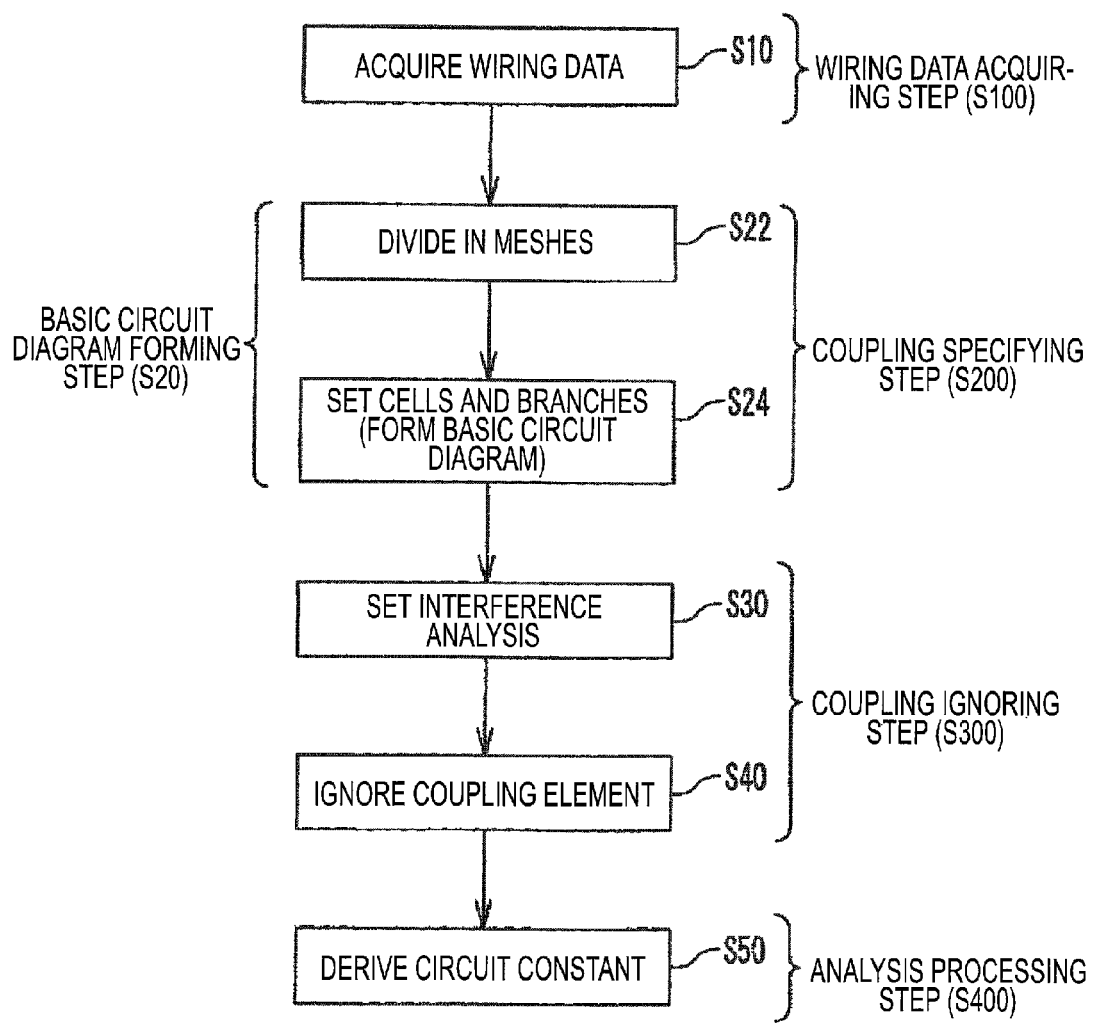
FIG. 3 is a flowchart illustrating a circuit board analyzing method according to an embodiment of the invention.
Figure 4:
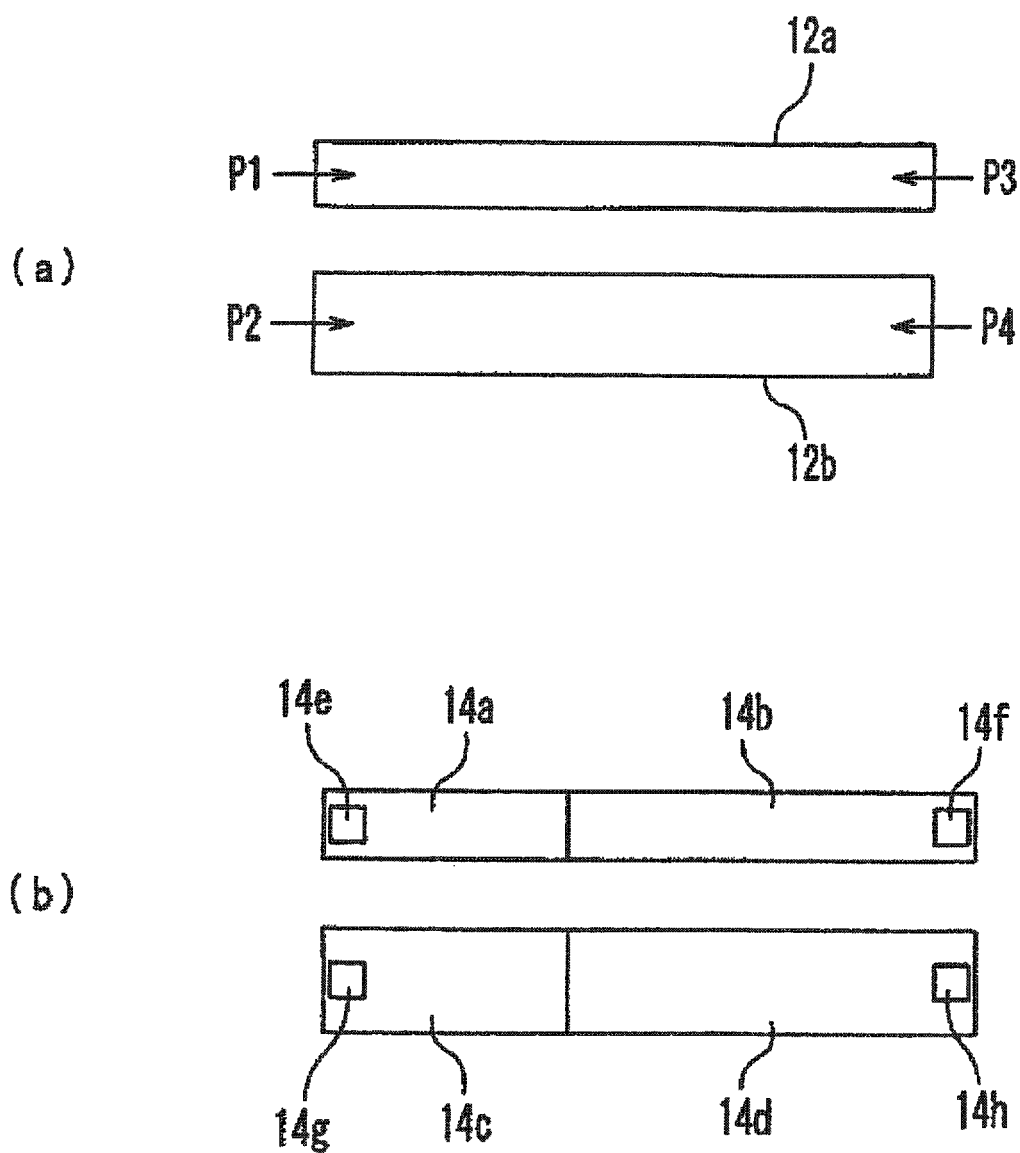
FIG. 4(a) is a diagram illustrating an example of an acquired wiring layout according to an embodiment of the invention and FIG. 4(b) is a diagram illustrating an example of a wiring layout divided in a mesh shape and having cells set therein.

A circuit board analyzing method according to an embodiment of the invention will be described now with reference to FIG. 3. FIG. 3 is a flowchart illustrating the circuit board analyzing method according to this embodiment.

In a wiring data acquiring step (S100), wiring data including layout data of wirings formed on the circuit board to be analyzed is acquired. The layout data includes, for example, shape data (origin coordinates, pattern length, pattern width, and the like) of wiring patterns. In case of a multi-layered board, the layout data includes shape data of wiring patterns in the respective layers. This step is performed by the wiring data acquiring section 410. Specifically, the wiring data acquiring section 410 receives an input from the input unit 160 such as a keyboard or a mouse, generates image data indicating the layout of the circuit board in response to the input, and displays the result on a display 150.

Then, in a coupling specifying step (S200), coupling occurrence positions in the layout of the circuit board are specified on the basis of the layout of wirings generated in the wiring data acquiring step. This step is performed by the coupling specifying section 420. That is, the coupling specifying section 420 specifies the coupling occurrence positions in the layout on the basis of the layout of wirings. The specifying of the coupling occurrence positions can be carried out using various methods, but is carried out by preparing an equivalent circuit model from the layout of wirings in this embodiment. More specifically, the layout of wirings is divided into meshes and the couplings (for example, parasitic capacitance) occurring between the meshes is made into an equivalent circuit model to specify the coupling occurrence positions. The possible equivalent circuit model will be described in detail later.

In a coupling ignoring step (S300), a setting operation of ignoring a specific coupling is performed during occurrence of the coupling. The setting operation of ignoring the coupling is performed, for example, by replacing off-diagonal elements in a determinant with 0. This step is performed by the coupling ignoring section 430. That is, the coupling ignoring section 430 replaces the off-diagonal element of a matrix corresponding to the specific coupling with 0 (zero). The determinant may employ various determinants used in the electromagnetic field analysis, such as an impedance matrix equation Z used in the moment method and a determinant including elements (LGC) divided from the impedance matrix equation Z.

A designer of the circuit board can freely set a coupling ignoring range (that is, replace the off-diagonal elements corresponding to some couplings with 0). That is, the coupling ignoring section 430 receives an input from the input unit 160 such as a keyboard or a mouse, sets the coupling ignoring range, and replaces the off-diagonal elements of the matrix corresponding to the set couplings on the basis of the setting of the coupling ignoring range with 0. The coupling ignoring range in this embodiment is set on the basis of the minimum distance between the meshes.

Then, in an analyzing step (S300), an analysis process (for example, the electromagnetic field analysis using the moment method) is performed. This process is performed by the analyzing section 440. The analyzing section 440 according to this embodiment performs the analysis process using the determinant of which some elements are replaced with 0 in the coupling ignoring step (S300).

In the above-mentioned configuration, since various electromagnetic field analyses can be carried out using the determinant having many 0 elements and close to a diagonal matrix, it is possible to complete the computation for a very short time. That is, in the circuit board analyzing method according to this embodiment, since the coupling occurrence positions in the layout of the circuit board are first specified and then the setting operation of ignoring the couplings is performed during occurrence of the couplings, it is possible to selectively ignore the couplings, which may occur in the layout, and to perform the analysis process.

In the typical electromagnetic field analysis, impedance Z can be derived as the result of the wiring interference, but parasitic components cannot be separated before the analysis. Accordingly, it is necessary to analyze all the meshes. As a result, great time is required for the analysis process and the analysis may not be completed in case of a complex wiring pattern. On the contrary, in this embodiment, the coupling components which could not be separated in the typical electromagnetic field analysis can be separated by specifying the coupling occurrence positions in advance and thus the coupling components not greatly contributing to the wiring interference can be selectively ignored for computation. Accordingly, it is possible to greatly reduce the analyzing time. As a result, it is possible to perform an analysis of a complex wiring pattern or a large-scale analysis which could not be coped with by the typical electromagnetic field analysis. Since the processing time can be greatly reduced, it is possible to facilitate the feedback to the design of the circuit device and thus to optimize the layout of the circuit device.

The circuit board analyzing method according to this embodiment will be described with reference to FIG. 3. FIG. 3 is a flowchart illustrating the circuit board analyzing method according to this embodiment.

The circuit board analyzing method according to this embodiment is a method of analyzing a wiring layout of a circuit board. A wiring data acquiring step (S10) of acquiring data (for example, "30" in FIG. 1) of wirings formed on the circuit board is performed and then a basic circuit diagram forming step (S20) of dividing the wirings into meshes and setting cells ("32" in FIG. 1) and branches ("34" in FIG. 1) connecting the adjacent cells is performed. In this embodiment, the basic circuit diagram forming step (S20) includes a step (S22) of dividing the wirings into meshes and a step (S24) of setting the cells and the branches. Briefly mentioning the elements (for example, parasitic capacitance C) set in the cells and the branches using the equivalent circuit model shown in FIG. 1(b), serial resistance (R) and serial self inductance (L) are set in the branches 34 and mutual inductance (L) is set between the branches 34. Capacitance (C) and conductance (G) are set in the cells 32 with respect to the ground and capacitance (C) and conductance (G) are set between the cells 32.

An interference analysis setting step (S30) of setting an element ignoring range is performed on the elements set in the cells, between the cells, in the branches, and between the branches and an element ignoring step (S40) of ignoring an element is then performed on the basis of the setting of the element ignoring range. Finally, a circuit constant deriving step (S50) of deriving element values corresponding to circuit constants of the elements set in the cells, between the cells, in the branches, and between the branches is performed.

The circuit board analyzing method according to this embodiment will be additionally described in detail with reference to FIGS. 4 to 9 in addition to FIG. 3.

As shown in FIG. 3, first, the wiring data of wirings formed on the circuit board is acquired (step S10). Here, the acquired wiring data can be data set to divide the wiring into meshes and to set the cells and the branches and specifically, can include data indicating the layout of the wirings formed on the circuit board.

An example of the wiring layout acquired in step S10 is shown in FIG. 4(a). Here, two wirings (12a and 12b) are arranged parallel to each other on the circuit board. Ports (P1, P2, P3, and P4) are set at both ends of the wirings (12a and 12b). Specifically, port P1 is set at the left end of the wiring 12a and port P2 is set at the right end of the wiring 12a. Port P3 is set at the left end of the wiring 12b and port P4 is set at the right end of the wiring 12b. The ports (P1 to P4) have a function of inputting and outputting external signals to and from the wirings (12a and 12b).

In step S20, the wirings acquired in step S10 are divided into meshes. The mesh division is to divide the wirings on the circuit board into plural areas in a mesh shape. The shape of the meshes can be a shape suitable for dividing the wiring into plural areas and may be rectangular, triangular, or polygonal. For example, in FIG. 4(b), the wirings (12a and 12b) are divided in a rectangular mesh shape.

In step S30, the divided pieces are set as cells. For example, in FIG. 4(b), the wiring 12a is divided into two meshes to set a cell 14a and a cell 14b. Similarly, the wiring 12b is divided into two meshes to set a cell 14c and a cell 14d. The setting of cells is performed on the ports inputting and outputting external signals. That is, the ports are treated as extremely small cells in the mesh division. The size of the cell set in the port can be properly changed depending on the analysis frequency. For example, when the upper limit of the analysis frequency is 6 GHz, a square cell a side of 0.5 mm is set in each port. Specifically, the cell 14e and the cell 14f are set in the ports (P1 and P2) of the wiring 12a and the cell 14g and the cell 14h are set in the ports (P3 and P4) of the wiring 12b.

Subsequently, branches are set between the adjacent cells on the basis of the physical connection states of the cells set in the above-mentioned way. The setting of branches is performed by constructing an electrical equivalent circuit model (basic circuit diagram), not a physical layout base. Specifically, the equivalent circuit model including the cells and the branches is constructed on the basis of the following setting condition J of (1) to (4).

<Setting Condition J of Cell and Branch>

(1) Serial Resistance (R) and self inductance (L) are set as self elements in each branch.

(2) Mutual inductance (L) is set as a mutual element between the branches.

(3) Capacitance (C) and conductance (G) are set as self elements in each cell with respect to the ground.

(4) Capacitance (C) and conductance (G) are set as mutual elements between the cells.

Here, the mutual elements (LCG) in (2) and (4) are so-called parasitic elements (or coupling elements) and are parameters set to specify interactions (coupling relation) having an influence on electrical characteristics from the connection state between cells in the layout base.

The self elements (RLGC) in (1) and (3) are electrical characteristics of the cells or the branches.

More specifically, in this embodiment, the moment method is used as the analysis method. In the moment method, a rooftop base function is defined between the cells of the neighboring meshes. When current I and voltage V are calculated from the electromagnetic field, the impedance matrix equation $Z([Z]\cdot[I]=[V])$ is obtained from the rooftop base function. The self elements (RLGC) and the mutual elements (LCG) set in this embodiment are obtained by making the impedance Z discrete and analyzing the equivalent circuit model. Specifically, the impedance is divided into the self elements using the expression of $[Rs+j\omega Ls+1/(j\omega Cs)+Gs]\cdot[I]=[V]$ and the impedance is divided into the mutual elements using the expression of $[j\omega Lm+1/(j\omega Cm)+Gm]\cdot[I]=[V]$. In the analyzing method according to this embodiment, by making the designed layout an equivalent circuit model, the impedance Z is divided into the elements (RLGC) and then the elements are derived. The method of deriving the elements (RLGC) divided from the impedance Z is embodied, for example, by deriving Rs and the like from the divided impedance matrix equation using the current and voltage values calculated from the rooftop base function.

The equivalent circuit model of the layout shown in FIG. 4(b) is shown in FIGS. 5(a) and 5(b). To easily understand the equivalent circuit model, it is divided into inductance L (FIG. 5(a)) and capacitance C (FIG. 5(b)).

As shown in FIG. 5(a), the branch 16 (16a to 16f) is set between two adjacent cells 14. Each branch 16 electrically separates the cells 14 from each other and has self inductance (hereinafter, referred to as self L element). The self L element indicates a magnetic self coupling based on an incidental current base function. In the drawing, L11, L22, L33, L44, L55, and L66 correspond to the self L elements.

Mutual inductance (hereinafter, referred to as mutual L element) as parasitic component is set between the branches 16. For example, the mutual L elements (L12, L13, L14, L15, and L16) are set between the branch 16a and the other branches (16b to 16f). Here, to simplify the drawing, the mutual L elements between the other branches are omitted, but the mutual L elements are set therebetween similarly. In this model, the determinant of the self L elements of the branches and the mutual L elements between the branches is shown in FIG. 6. The elements of the L matrix correspond to the L elements set in the branches and between the branches, the self L elements are diagonal elements and the mutual L elements are off-diagonal elements. In this example, since 6 branches in total are set, the L matrix is a 6×6 matrix.

As shown in FIG. 5(b), each cell 14 has capacitance (hereinafter, referred to as self C element) with respect to the ground and the self C element indicates an electrical self coupling based on the incidental current base function. In the drawing, C11, C22, C33, C44, C55, C66, C77, and C88 correspond to the self C elements.

Capacitance (hereinafter, referred to as mutual C element) as the parasitic capacitance component is set between the cells 14. C12, C13, C14, C15, C16, C17, and C18 in the drawing are mutual C elements. The mutual C elements between the other cells are omitted, but the mutual C elements are actually set therebetween. In this model, the determinant of the self C elements of the cells and the mutual C elements between the cells is shown in FIG. 7(a). The elements of the C matrix correspond to the C elements set in the cells and between the cells, the self C elements are diagonal elements and the mutual C elements are off-diagonal elements. In this model, since 8 cells in total are set, the C matrix is an 8×8 matrix. The C matrix used in the actual analysis process is separated in the form of reciprocals (1/C') from the impedance Z and the determinant shown in FIG. 7(a) is obtained by further transforming the separated reciprocals (1/C') into an inverse matrix.

In this way, when the equivalent circuit model is formed, as shown in the L matrix in FIG. 6 and in the C matrix in FIG. 7(a), the mutual L elements and the mutual C elements, which are parasitic components, can be separated and expressed. That is, the mutual elements contributing to the wiring interference can be specified. In the typical electromagnetic field analysis, impedance Z can be derived as the result of the wiring interference, but parasitic components cannot be separated before the analysis. Accordingly, it is necessary to analyze all the meshes. As a result, great time is required for the analysis process and the analysis may not be completed in case of a complex wiring pattern. On the contrary, in this embodiment, the mutual elements which could not be separated in the typical electromagnetic field analysis can be separated by forming the equivalent circuit model and thus the mutual elements not greatly contributing to the wiring interference can be selectively ignored for computation.

The method of selecting the mutual elements not contributing to the wiring interference will be described in the fowling step. It will be described now that the mutual C elements set between the cells are selectively ignored, but the mutual elements (LG) as the other parasitic components can be similarly ignored.

After the equivalent circuit model is formed from the layout, the process of step S40 is performed. A mutual C element ignoring range (in other words, the interference range reflecting the mutual C element) is set on the mutual C elements set between the cells. That is, in step S40, the mutual C elements not contributing to the wiring interference are selected. The interference range can be set on the basis of various information (such as threshold values of the coupling element values), but the interference range is set on the basis of the physical distances between the cells in this embodiment.

Figure 8:
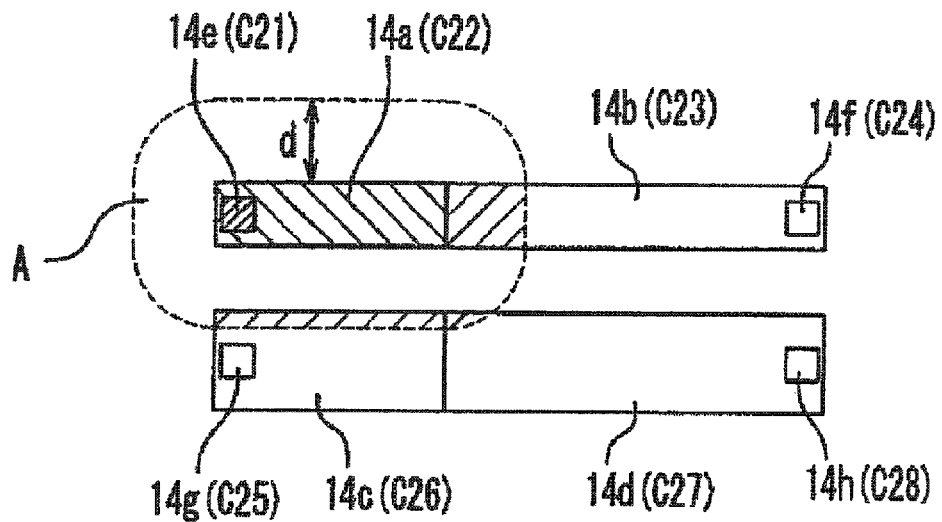
FIG. 8 is a diagram illustrating an operation of setting an interference range using distances between the cells at the time of deriving elements (CG).

The setting of the interference range based on the distances between the cells is carried out on the basis of the layout (arrangement) information of the cells, as shown in FIG. 8. FIG. 8 is a diagram illustrating an example where the interference range of the cell 14a is set.

When an interference range distance d (for example, d =1 mm) for setting the interference range is input, an interference range area A having a width d (1 mm) from the boundary line of the cell 14a is set to surround the cell 14a. The interference range area A serves as an area for defining up to what range the mutual interference (coupling relation) of the cell 14a and the neighboring cells should be considered. That is, the cells outside the interference range area A are not considered in coupling to the cell 14a and thus the mutual C elements set between the cell 14a and the cells are ignored. The cells 14c, 14g, and 14h in the drawing correspond to the cells outside the interference range area A. On the other hand, the cells inside the interference range area A are considered in coupling to the cell 14a and thus the mutual C elements set between the cell 14a and the cells are not ignored. The cells 14b, 14c, 14d, 14e, and 14g in the drawing correspond to the cells inside the interference range area A.

In this embodiment, even when a part of a cell is included in the interference range area A, the coupling relation thereof is considered (that is, is not ignored). Although it has been described that the interference range is set with respect to the cell 14a, the interference ranges of the other cells (14b to 14h) are set similarly.

The setting of the interference range based on the distances between the cells is not limited to the method using the interference range area A, but may employ other methods. For example, the center positions of the cells in the layout base may be measured and the coupling relation may be considered when the distance between the center positions is smaller than the interference range distance d.

After setting the interference range in this way, the operation of ignoring the mutual C element is performed on the basis of the setting of the mutual C element ignoring range (interference range) (step S50). In this embodiment, the operation of ignoring the mutual C element is carried out by replacing some elements of the C matrix (see FIG. 7(a)) with 0 (zero). That is, in the C matrix including the self C elements and the mutual C elements, the mutual C elements set between the cells of which the coupling relation is not considered are replaced with 0. The parasitic capacitive components set between the cells can be excluded by this process. FIG. 7(b) shows a C matrix after the operation of ignoring the mutual C element is performed in the model shown in FIG. 6. Under this setting condition, for example, since the coupling relation between the cell 14a and the cell 14c is not considered, the mutual C elements (C24 and C42) between the cell 14a and the cell 14c are replaced with 0.

By performing the operation of ignoring the mutual C element in this way, the 0 elements of the C matrix increase (32 elements of 64 elements in total are 0 elements in FIG. 7(b)). Since the mutual C elements replaced with 0 are off-diagonal elements, the C matrix gets closer to a diagonal matrix as the mutual C element ignoring range is more enlarged.

When the analysis process is performed using the C matrix close to the diagonal matrix (step S60), the values of the elements (that is, the self C elements and the mutual C elements) of the C matrix can be specifically derived. Since the deriving of the C element values can be carried out using the matrix close to a diagonal matrix having many 0 elements, the computation can be completed for a very short time. Since the mutual C elements not contributing to the wiring interference can be selectively ignored for computation by setting the interference range in this way, it is possible to greatly reduce the time for the analysis process. An example of the C matrix after the deriving is shown in FIG. 7(c). This example is simple where the total number of cells is 8 and the total number of elements is 64, but the number of cells and the number of elements are great in an actual wiring pattern. Accordingly, the computation using a matrix close to a diagonal matrix has a great merit.

In the circuit board analyzing method according to this embodiment, by dividing a wiring into meshes and setting cells and the branches (forming an equivalent circuit model), it is possible to specify the influence and characteristic of the inter-wiring interference as the mutual elements (LCG). In addition, since the analysis process is performed after the mutual elements having a small influence on the wiring interference among the specified mutual elements are ignored (that is, since the interference range is restricted), it is possible to make a computation without considering the mutual elements having a small influence on the wiring interference. Accordingly, it is possible to embody a high-speed analysis process while maintaining the analysis precision to a certain extent. As a result, it is possible to perform an analysis of a complex wiring pattern or a large-scale analysis which could not be coped with by the typical electromagnetic field analysis. Since the processing time can be greatly reduced, it is possible to facilitate the feedback to the design of the circuit board and thus to optimize the layout of the circuit board.

In the example, the mutual C elements set between the cells are ignored. However, the ignorable mutual elements are not limited to the mutual C elements, but conductance (hereinafter, referred to as mutual G element) set between the cells can be ignored. In this case, by setting the mutual G element ignoring range on the basis of the physical distances between the cells and then ignoring the mutual G elements set between the cells of which the coupling relations are not considered, it is possible to derive the element values corresponding to the circuit constants of the set G elements for a short time.

Figure 9:
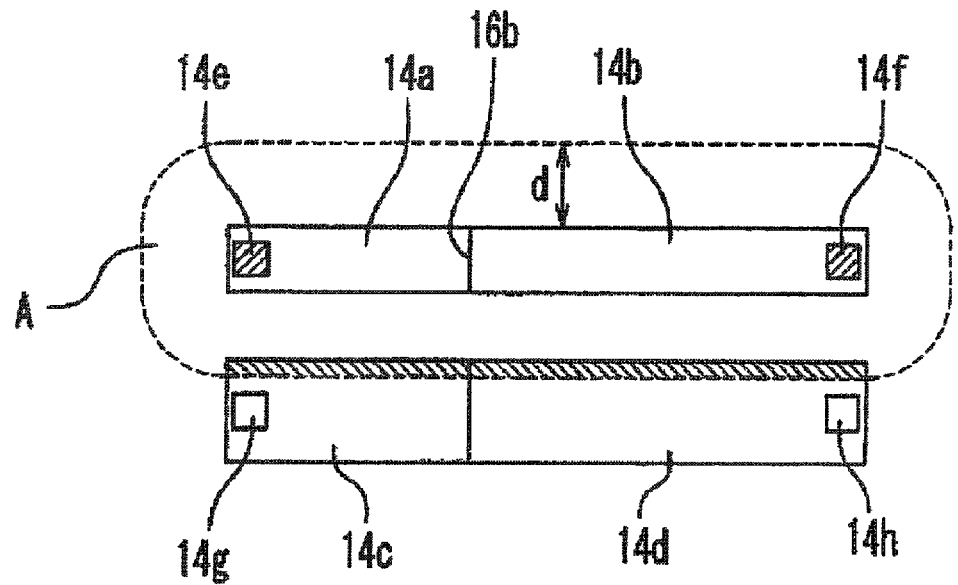
FIG. 9 is a diagram illustrating an operation of setting an interference range using distances between the cells at the time of deriving elements (RL).

Similarly, the mutual L elements set between the branches can be ignored. In this case, by ignoring the mutual L elements on the basis of the setting of the mutual L element ignoring range, it is possible to derive the element values corresponding to the circuit constants of the mutual L elements for a short time. However, since the branches cannot be expressed by the layout base, the distances between the branches are calculated on the basis of the arrangement of two cells connected by each branch. For example, as shown in FIG. 9, the interference range area A of the branch 16b connecting the cell 14a and the cell 14b adjacent to each other is set on the basis of the layout of the cell 14a and the cell 14b.

A step of analyzing the element values (RLGC) extracted in step S60 using various analysis tools may be provided. Accordingly, it is possible to obtain an indicator for estimating electrical characteristics of the designed circuit board. For example, a step (circuit analyzing step) of computing a circuit matrix (for example, S matrix) using the derived element values may be provided. In addition to the S matrix often used in the art, for example, a Z matrix, a Y matrix, an F matrix, and a T matrix may be used as the circuit matrix. Z, Y, F, and T parameters (that is, parameters constituting the Z matrix, the Y matrix, the F matrix and the T matrix) and the S parameter (that is, parameter constituting the S matrix) can be converted into each other.

Before computing the circuit matrix (that is, between step S60 and the circuit analyzing step), an additional operation of ignoring an element may be performed on the element values derived in step S60. That is, the threshold value a of the derived element values may be provided and the element values smaller than the threshold value a may be ignored. For example, when the element having an element value smaller than the threshold value a =0.2 μF is ignored (that is, replaced with 0) among the derived element values of C in FIG. 7(c), the result is shown in FIG. 7(d). The number of 0 elements in the C matrix increases by this process. Accordingly, since the number of 0 elements in the C matrix used in computing the circuit matrix can be made to further increase, it is possible to compute the circuit matrix at a higher speed. When the elements are ignored using the element values, the self C elements set in the cells as well as the mutual C elements set between the cells can be ignored. That is, in the above-mentioned configuration, the diagonal elements in addition to the off-diagonal elements of the determinant can be replaced with 0 and thus the time for computing the circuit matrix can be further reduced.

The derived element values can be used for various analyses as well as for computing the circuit matrix (for example, the S matrix). For example, by using the derived element values, a net list may be prepared or an equivalent circuit may be prepared. When the equivalent circuit model is formed using the derived element values, a circuit calculation process may be additionally performed by a centralized constant circuit.

Figure 10:
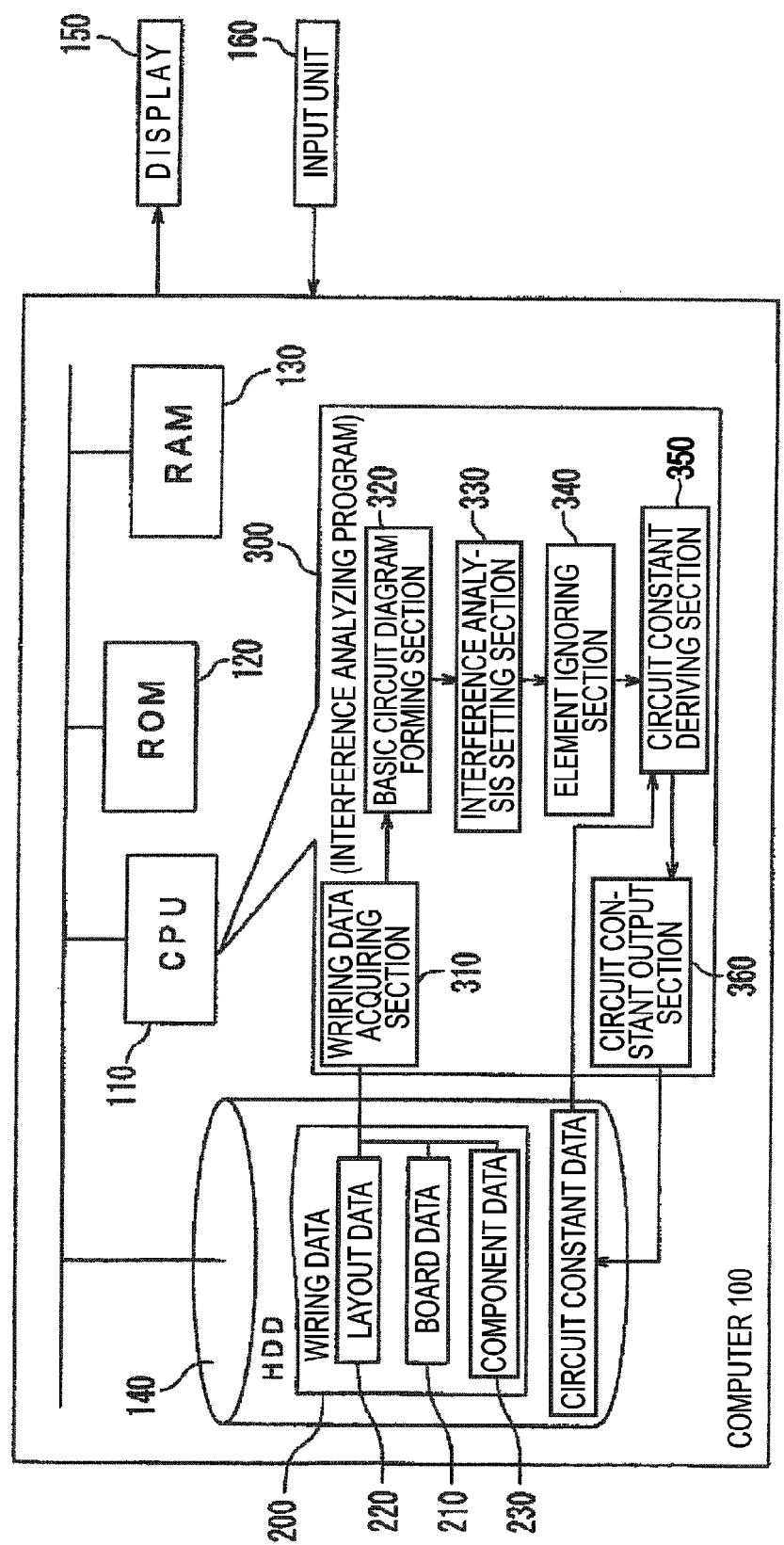
FIG. 10 is a block diagram illustrating a configuration of a circuit board analyzer according to an embodiment of the invention.

The circuit analyzing method according to this embodiment can be carried out, for example, by the circuit analyzer shown in FIG. 10. FIG. 10 is a block diagram illustrating a schematic configuration where the circuit analyzer according to this embodiment is embodied by the computer 100. As shown in FIG. 10, the computer 100 includes a CPU (computing unit) 110, a ROM 120, a RAM 130, and an HDD (memory unit) 140. The computer 100 is connected to a display 150 and a keyboard and a mouse (input unit) 160 through an interface not shown. The CPU 110 outputs data for various displays to the display 150 through the interface. The display 150 acquires the data and displays the data in various forms. The CPU 110 acquires signals from the keyboard and the mouse (input unit 160) through the interface and performs processes in accordance with the operation of the input unit 160.

The CPU 110 can execute a program stored in the ROM 120 or the HDD 140 using the RAM 130 as a work area. In this embodiment, an example of the program is an interference analyzing program 300. In this embodiment, the interference analyzing program 300 has a function of analyzing a circuit board built in various electronic apparatuses and supports an operation of determining a wiring pattern formed on the circuit board and a layout of various components mounted on the board using the wiring data 200 recorded in the HDD 140.

The wiring data 200 includes board data 210, layout data 220, and component data 230. The board data 210 is data indicating the size, structure, and material of the circuit device. When the circuit device to be designed is a multi-layered board, the board data includes data indicating the configurations of layers or the material constants of the layers. The layout data 220 is data indicating a layout of wirings formed on the board and includes, for example, shape data (origin coordinates, pattern lengths, pattern widths) of the wiring pattern. When the analysis target is a multi-layered board, the layout data includes shape data of the wiring patterns of the layers. The component data 230 is data indicating characteristics of various components constituting circuits of the circuit device.

The interference analyzing program 300 analyzes the interference of a desired circuit board on the basis of the data prepared in advance or the data generated in the course of circuit design. Accordingly, the interference analyzing program 300 includes a wiring data acquiring section 310 acquiring the wiring data 200 of wirings formed on the circuit board, a basic circuit diagram forming section 320 dividing the wirings into meshes and setting the cells and the branches, an interference analysis setting section 330 setting an element ignoring range of the elements set in the cells and the branches, a coupling ignoring section 340 performing an operation of ignoring a coupling on the basis of the setting of the element ignoring range, a circuit constant deriving section 350 deriving element values of the elements set in the cells and the branches, and a circuit constant output section 360 outputting the derived element values.

The interference analyzing program 300 can be recorded on a recording medium readable by the computer 100 (such as an optical recording medium, a magnetic recording medium, a magneto-optical recording medium, and a flash memory). The circuit board analyzer may be constructed using the computer configuration of the CAD device. The CAD operation and the circuit board analyzing operation can be carried out by one apparatus. Since the circuit board analyzer simulates the circuit wirings, the circuit board analyzer may be called a circuit simulator in that meaning.

Figure 11:
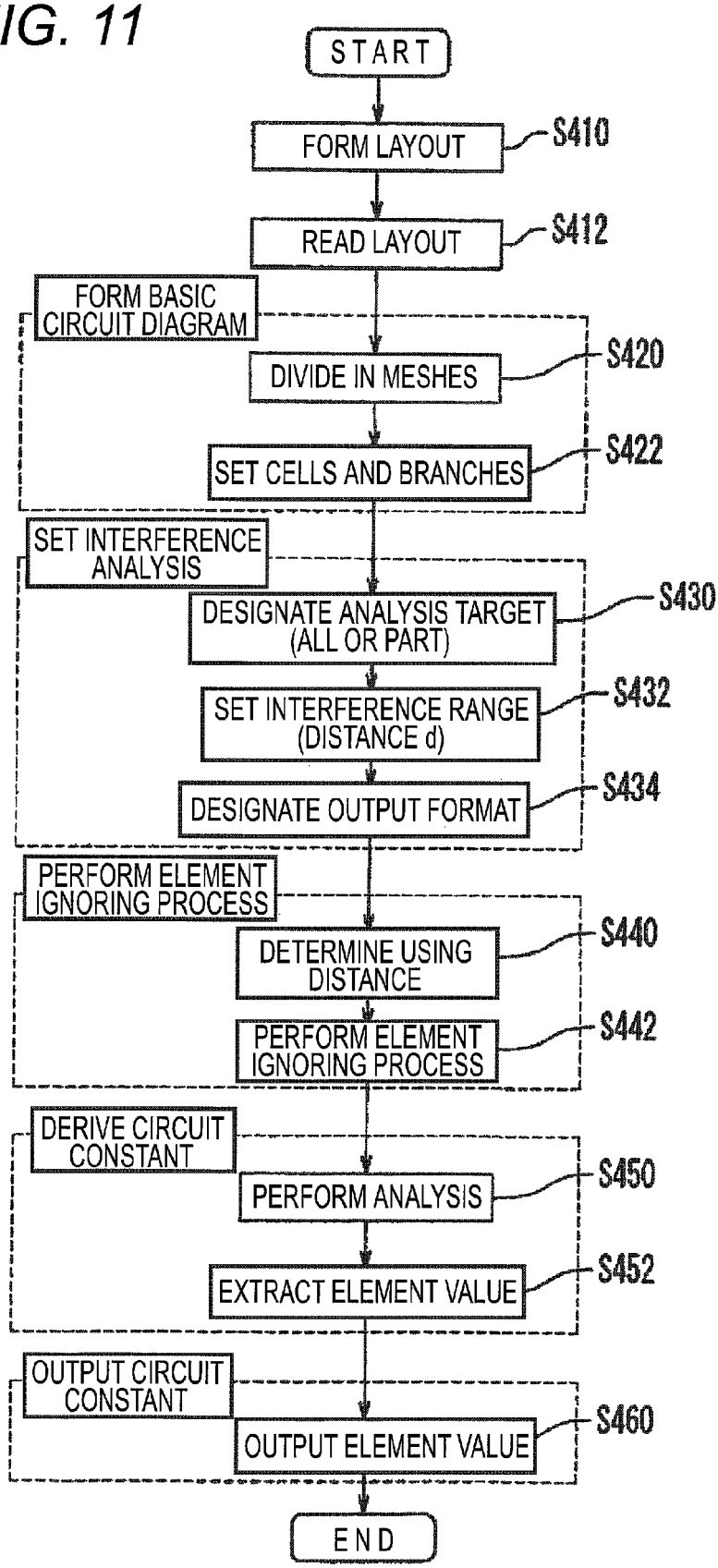
FIG. 11 is a flowchart illustrating an example of a circuit board analyzing method according to an embodiment of the invention.

The circuit board analyzing method according to this embodiment will be further described with reference to FIG. 11. FIG. 11 is a flowchart illustrating an example of the analyzing method according to this embodiment. The circuit board analyzing method can be used as a wiring board designing method including the circuit board analyzing process.

First, a layout of wirings formed on the circuit board is prepared (step S410) and the layout is read (step S412). This step is performed by the wiring data acquiring section 310. Specifically, the wiring data acquiring section 310 receives an instruction for preparing the layout of the board and generates the board data 210, the layout data 220, and the component data 230. That is, the wiring data acquiring section receives the input from the input unit 160 such as a keyboard or a mouse, generates image data indicating the layout of the circuit board in accordance with the input, displays the result on the display 150, and records the data indicating the layout as the layout data in the HDD 140. In this embodiment, the component data 230 is not read at the first time of analysis. That is, at the first time, the layout of the board is prepared and analyzed on the basis of the board data 210 and the layout data 220 and at the second and later times, the component data is additionally used to prepare the layout of the board.

The wiring data acquiring section 310 may acquire the board data 210, the layout data 220, and the component data 230 prepared in advance and recorded in the HDD 140 and may display the data as a diagram indicating the layout of the circuit board. That is, the wiring data acquiring section acquires the board data 210, the layout data 220, and the component data 230, prepares the layout, and outputs the layout to the display 150. As a result, the layout of the board is displayed on the display 150.

Then, the wirings acquired in step S412 are divided into meshes (step S420). The mesh division is carried out on the basis of a mesh condition. The mesh condition includes, for example, an analysis frequency (or frequency point) or a mesh density (or the number of meshes). The mesh density to be set is preferably about $1/30$ of a wavelength $\lambda$ of the analysis frequency. The mesh condition can be properly set depending on the shape or kind of the circuit board to be analyzed.

Then, the cells and the branches are set (step S422). Step S420 and step S422 are performed by the basic circuit diagram forming section 320. That is, the basic circuit diagram forming section 320 receives the input of the mesh condition from the input unit 160, divides the wirings of the circuit board into meshes, sets the cells in the layout base, displays the result on the display 150, specifies the coupling relation on the basis of the connections between the cells (that is, sets the self elements and the mutual elements on the basis of the setting condition J), and forms a basic circuit diagram as an equivalent circuit model.

In this example, the mesh division (step S420) and the construction of the equivalent circuit model (step S430) are separately performed, but the steps may be performed at the same time. That is, the equivalent circuit model may be prepared at the same time as dividing the wirings into meshes.

In step S430, an analysis target area is specified. The analysis target area is an area to be actually analyzed in the area including the read wiring layout. That is, in the circuit analyzer according to this embodiment, all the acquired wiring layouts are not analyzed, but a part of the wirings may be selectively extracted and locally analyzed. The analysis target area may be an area including all the wirings on the circuit board or may be an area including some wirings on the circuit board. The specification of the analysis target area may be performed in the unit of cells or plural cells may be selected, grouped, and used as the analysis target area. Alternatively, the analysis target area may be specified on the basis of the ports for inputting and outputting external signals. Accordingly, an equivalent circuit of a specific portion of the circuit board may be prepared or the interference between specific elements (cells) may be extracted. The specification of the analysis target area is performed by the interference analysis setting section 330. That is, the interference analysis setting section 330 has a probing function of selecting at least a part of the area including the wirings of the circuit board as the analysis target area.

Then, the interference range is set (step S432). The interference range is a range in which the mutual elements (LCG) set between the cells and between the branches are considered. In other words, in this step, the mutual element (LCG) ignoring range is set. The interference range can be set on the basis of a variety of information, but is set on the basis of the physical distances between the cells in this embodiment. That is, the interference range distance d as a reference for ignoring the mutual elements is set here. For example, when the designer of the circuit board intends to perform the analyzing operation in consideration of the mutual elements where the distance from the target cell is less than 0.2 mm, 0.2 mm can be input as the interference range distance d. When it is intended to consider the mutual elements in the broader range, for example, 1 mm may be input. Alternatively, 0 mm may be input as the interference range distance d. In this case, since the analyzing operation is performed without considering the mutual elements set between the cells and between the branches at all, it is possible to greatly reduce the computing time. The setting of the interference range area is carried out by the interference analysis setting section 330 in response to the input from the input unit. The interference analysis setting section 330 stores the set interference range distance d in the RAM 130.

A step of specifying the output format may be provided after setting the interference range (step S434). In this step, in what format to finally output the derived element values can be selected. For example, in this embodiment, the net list format or the S parameter format can be selected as the output format.

Then, the process of ignoring an element is performed on the basis of the setting of the interference range (interference range distance d) (first element ignoring step). The element ignoring process is carried out by the element ignoring section 340. First, the element ignoring section 340 determines whether the minimum distance between the cells is in the interference range set in step S432 (step S450). Specifically, the element ignoring section 340 reads the interference range distance d recorded in the RAM 130, compares the interference range distance d with the minimum distance between the cells, and determines whether the minimum distance between the cells is smaller than the interference range distance d. Subsequently, the element ignoring section 340 performs the element ignoring process on the mutual elements between the cells between which the minimum distance is determined not to be smaller than the interference range distance d (step S442). An example of the element ignoring process is a process of replacing the mutual elements set between the cells of which the coupling relation is not considered with 0 in the matrix including a group of the elements, as shown in FIG. 7(*b*).

The analysis process is performed using the matrix including a group of elements (step S450) and values of the set elements (RLGC) are derived using the equivalent circuit model (step S462). Here, the analyzing method is not particularly limited, but various methods such as the moment method and the PEEC (Partial Element Equivalent Circuit) method may be employed. Alternatively, the quasi-static approach of a green function may be employed. When the quasi-static approach of a green function is used, it is possible to markedly enhance the analysis speed. It is possible to specifically derive the values of the elements (RLGC) by the analysis process.

The derived element values (circuit constants) are output (step S460). The output of the element values is carried out by the circuit constant output section 360. That is, the circuit constant output section 360 displays the element values on the display 150 on the basis of the derived element values. The display on the display 150 is carried out in the output format specified in step S434. For example, when the designer of the circuit board selects the output of the net list format in step S434, the circuit constant output section 360 prepares a net list using the derived element values and displays the net list on the display 150. Alternatively, when the designer selects the output of the S parameter format, the circuit constant output section 360 may display the element values on the display 150 in the S parameter format. In this case, the circuit constant output section 360 additionally performs a step of computing the circuit matrix (here, the S matrix). That is, the circuit constant output section 360 computes the circuit matrix (S matrix) using the derived element values and displays the S parameter obtained from the computation on the display 150. An example of the displayed S parameter may be an "S21" parameter as an indicator for estimating a filter characteristic, for example, when the circuit board having a filter circuit element is analyzed. Alternatively, an equivalent circuit may be prepared using the derived element values and the equivalent circuit may be displayed on the display 150. Of course, values obtained in the course of analysis or other values calculated from the values may be displayed. Appropriate pictures may be displayed on the screen of the display 150 depending on the characteristics of the circuit board to be analyzed. A current distribution may be displayed on the layout on the basis of the derived S parameter.

The circuit constant output section 360 stores the derived element values as the circuit constant data in the memory unit (for example, the HDD 140 or the RAM 130). The circuit constant data stored in the memory unit can be re-used at the time of next analyzing the circuit board. That is, at the time of deriving the circuit constants in step S350, the circuit constant deriving section 350 reads the circuit constant data stored in the memory unit and replaces unknown elements of the matrix with the predetermined element values. For example, the C element set to 0.2 pF in the first analysis result is replaced with the element value of 0.2 pF at the second time of analysis.

In this way, by storing the derived element values and reusing the derived element values, it is possible to reduce the number of unknown parameters in the matrix and thus to further reduce the time for the analysis process. This process is effective when it is intended to analyze the same wiring layout while gradually widening the interference range or when it is intended to analyze the same wiring layout while changing the analysis target range. For example, when the interference range distance d is 0 mm and the circuit constants are computed without considering the coupling at all at the first time of analysis and the interference range distance d is set to 0.2 mm, 0.4 mm, . . . to gradually widen the interference range at the next times of analysis, it is possible to greatly reduce the analyzing time by reusing the circuit constants.

As described above, according to this embodiment, it is possible to perform the analysis process after setting the interference range and ignoring the elements having a small influence on the inter-wiring interference. Accordingly, it is possible to perform the high-speed analysis process. Since the extracted element values can be reused in the subsequent analysis, it is possible to further reduce the analyzing time. A part of the wirings may be selectively extracted and analyzed without analyzing the entire wiring layout.

In the above-mentioned example, the interference range in step S432 is set on the basis of the physical distances between the cells, but the interference range may be set on the basis of the derived element values.

Figure 12:
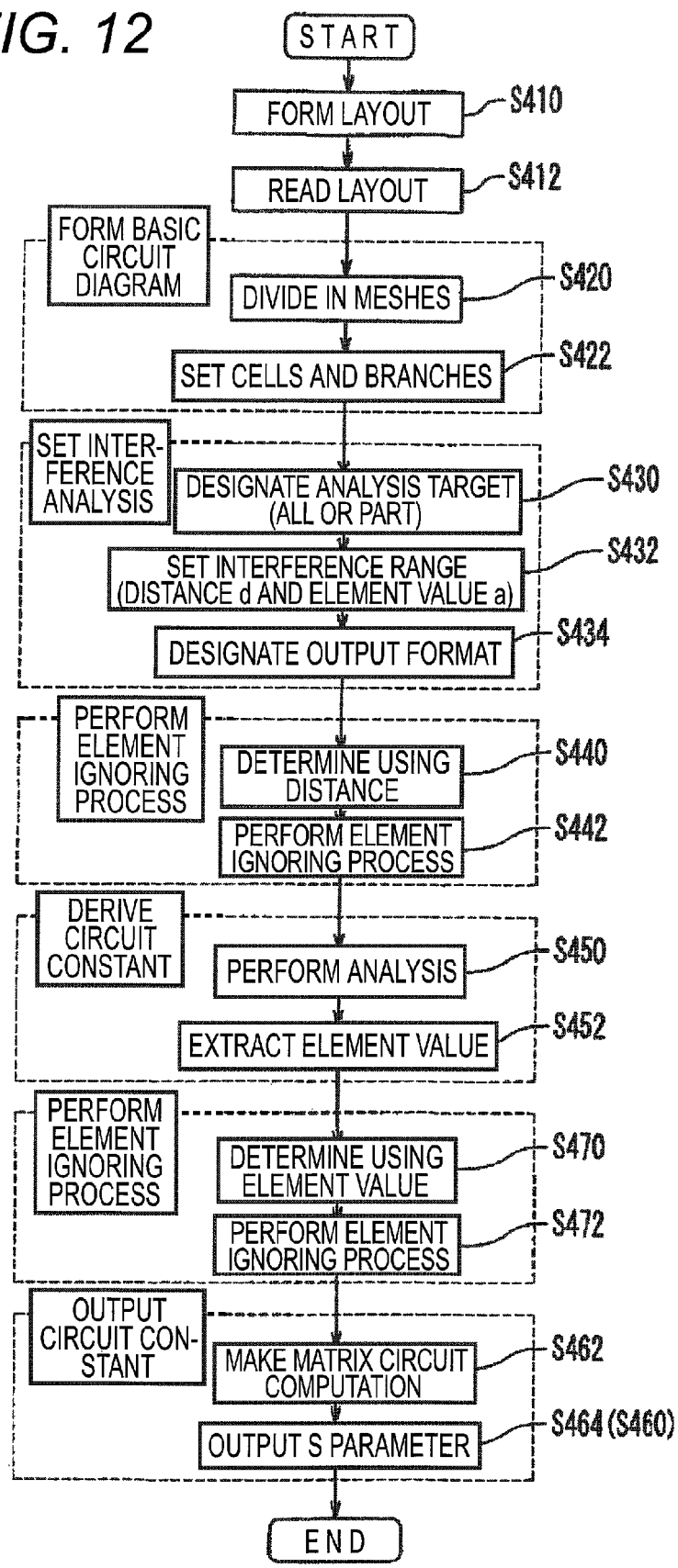
FIG. 12 is a flow chart illustrating an example of a circuit board analyzing method according to another embodiment of the invention.

The setting of the interference range using the element values will be described now with reference to FIG. 12. FIG. 12 is a flowchart illustrating an analyzing method according to another embodiment and is different from the flowchart shown in FIG. 11, in that the interference range is set using the element values as well as the distances between the cells. Accordingly, the same steps as the flowchart shown in FIG. 11 are referenced by the same reference numerals and the repeated description thereof is omitted.

In the flowchart shown in FIG. 12, the interference range is set on the basis of the physical distances between the cells and the element values in step S432. That is, in step S432, the interference range distance d as a reference for ignoring the elements and the threshold value a of the element values as a reference for ignoring the elements are set similarly. For example, when the element values corresponding to the circuit constants of the C elements is greater than 0.5 pF and the designer of the circuit board considers the couplings thereof, 0.5 pF can be input as the threshold value a. In this setting, the couplings with 0.5 pF or less are all ignored. At this time, the interference analysis setting section 330 receives the input from the input unit and stores the interference range distance d and the threshold value a in the RAM 130.

The ignoring of the elements with the threshold value a is carried out after the element values are derived in step S452 (second element ignoring step S470). That is, the element ignoring section 340 reads the threshold value a recorded in the RAM 130, compares the threshold value a with the derived element values, and determines whether the derived element values are smaller than the threshold value a. The element ignoring section 340 ignores the elements having the element values smaller than the threshold value a (that is, replaces the threshold values with 0). For example, in the C matrix shown in FIG. 7(c), when the threshold value a is set to 0.2 pF, the element values of 0.2 pF or less are replaced with 0 as shown in FIG. 7(d). By this process, 11 element values of 0.2 pF or less are replaced with 0.

The S parameter is derived by computing the circuit matrix using the derived element values (step S462). At this time, since some of the derived element values are 0 elements, the time for computation can be reduced. That is, a part of the matrix including a group of the derived element values can be replaced with 0 when the threshold value a is set for the element values and thus the circuit matrix can be computed at a high speed when the S parameter is acquired using the element values. That is, the setting of the interference range using the threshold value a of the element values is particularly effective when the analysis result is output in the S parameter format on the display 150 (step S464).

To check the effect of the circuit board analyzing method (for example, the analyzing method including the flowchart shown in FIG. 12) according to this embodiment, the inventor made an experiment of measuring the analyzing time when the wiring layout (wiring size of 1.6 mm×5.6 mm) shown in FIG. 13(b) was prepared to perform the typical electromagnetic field analysis using ideal circuit elements of a low-pass filter shown in FIG. 13(a), the analyzing time when the interference range distance d is set to 0.2 mm to perform the analysis process according to this embodiment, and the analyzing time when the interference range distance d is set to 0 mm to perform the analysis process according to this embodiment.

As a result, the analyzing time of the typical electromagnetic field analysis was 8 minutes but the analyzing time of the analysis process according to this embodiment was 8 seconds (d=0 mm) and 10 seconds (d=0.2 mm). Accordingly, it could be seen that the analyzing time is reduced greatly by the use of the analyzing method according to this embodiment. The reason that the analyzing time is smaller with d=0 mm than with d=0.2 mm is that the number of 0 elements in the matrix used in the computation is greater with d=0 mm. Specifically, with d=0.2 mm, the number of 0 elements in the C matrix is 15,000 and the number of 0 elements in the L matrix is 60,000, while the number of 0 elements in the C matrix is 18,000 ad the number of 0 elements in the L matrix is 70,000 with d =0 mm. Accordingly, it could be seen that the matrix gets closer to the diagonal matrix as the interference range distance d gets closer to 0 and thus the analyzing time can be reduced. In the analyzing condition, the analysis upper-limit frequency was set to 6 GHz and the mesh size was set to $\lambda/30$.

Figure 14:
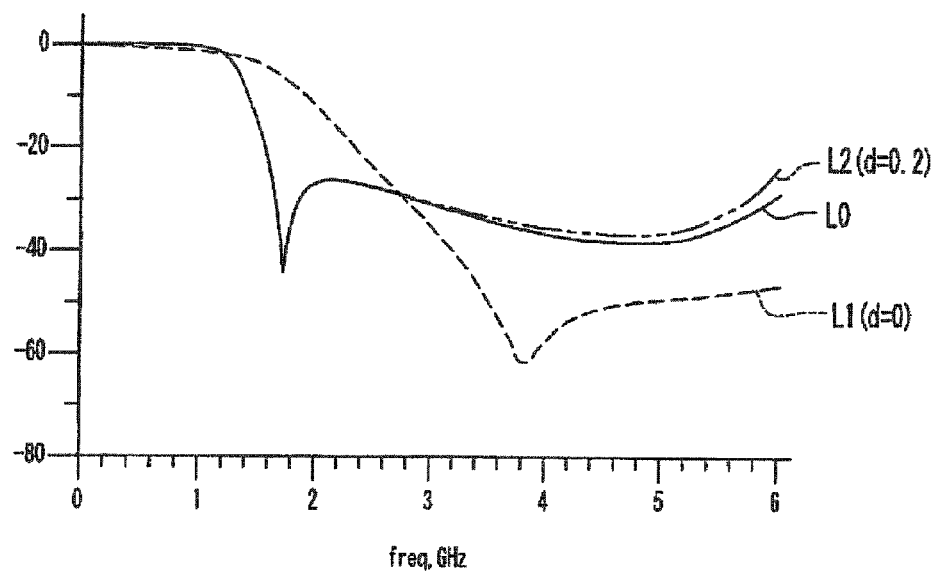
FIG. 14 is a diagram illustrating a filter characteristic indicating the analysis result of the wiring layout shown in FIG. 13(b).

The analysis result is shown in FIG. 14. Here, the analysis result output in the S parameter format (S21) is shown as the indicator for estimating the filter characteristic. Line L0 in the drawing represents the analysis result of the typical electromagnetic field analysis and line L1 represents the analysis result with d =0 mm, and line L2 represents the analysis result with d=0.2 mm. Line L1 with d =0 mm is greatly deviated from line L0 obtained from the typical electromagnetic field analysis but line L2 with d =0.2 mm is matched with line L0. That is, when the interference range distance d is set to 0.2 mm or more, it can be seen that the analysis precision comparable to the typical electromagnetic field analysis can be embodied.

Figure 15:
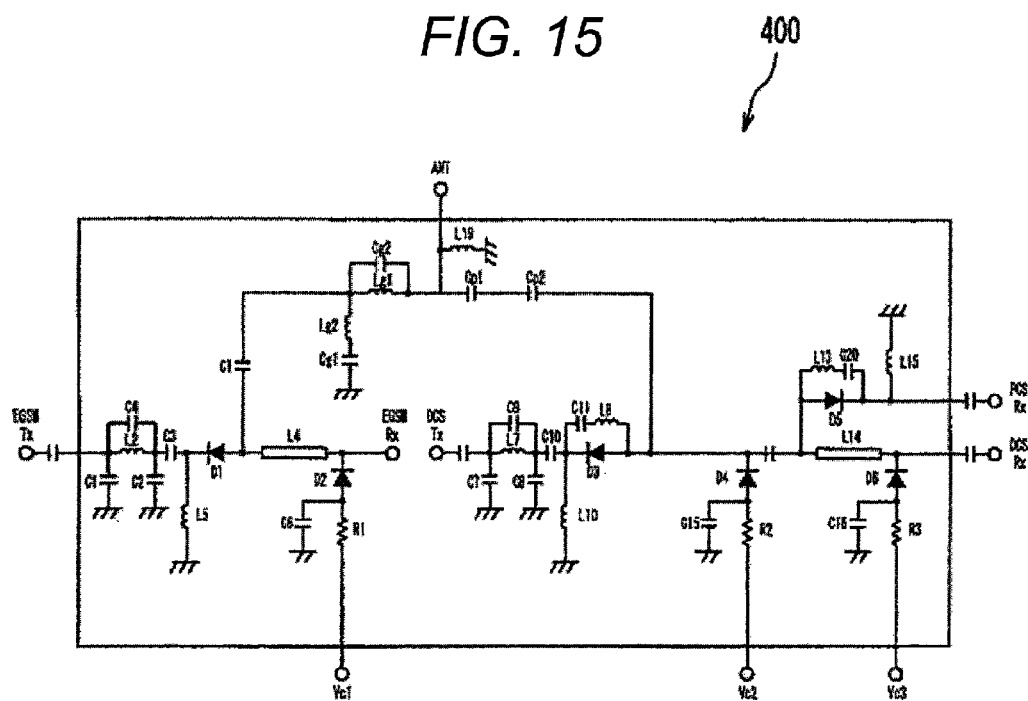
FIG. 15 is an ideal equivalent circuit diagram of an antenna switch module.
Figure 16:
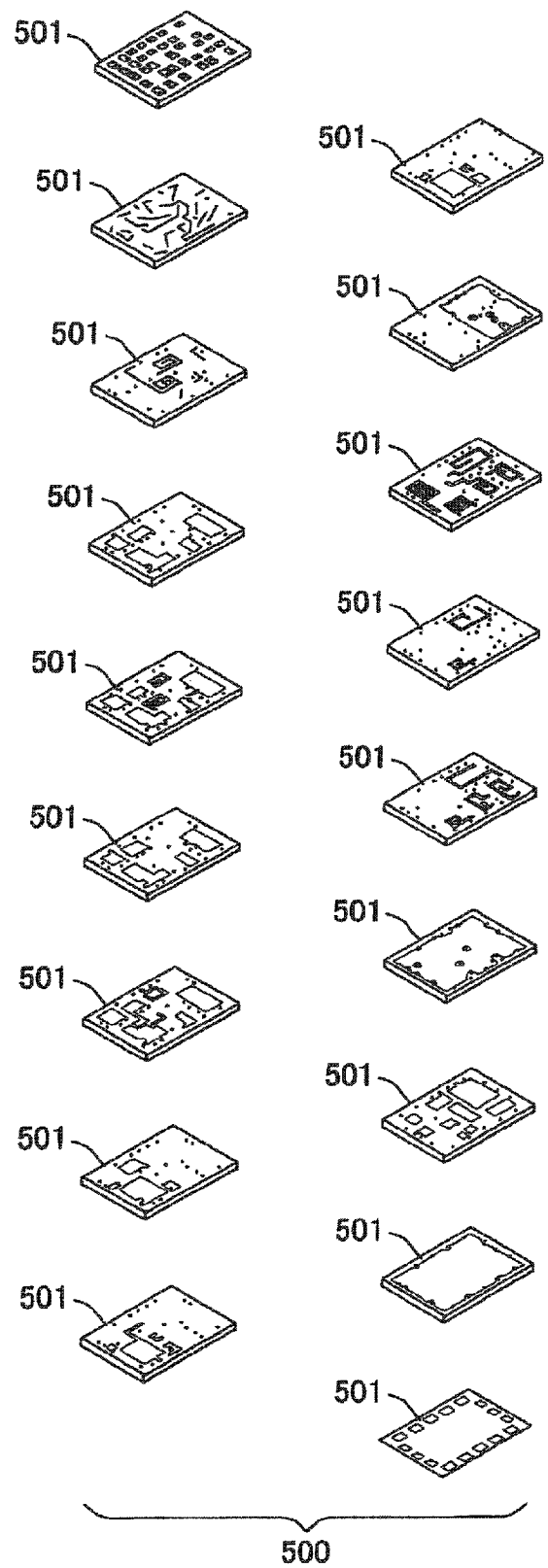
FIG. 16 is a diagram illustrating layers of a multi-layered board 500.

In the analyzing method according to this embodiment, when a circuit board having a configuration more complex than the circuit board having the simple configuration shown in FIG. 13 is analyzed, the more marked effect can be obtained. For example, when the ideal equivalent circuit 400 of the antenna switch module shown in FIG. 15 is designed in layout by the CAD, the multi-layered board 500 shown in FIG. 16 is obtained. In this way, when the complex multi-layered board 500 including 18 layers is to be analyzed, the wiring patterns are excessively complex and thus the analyzing time is great in the typical electromagnetic field analysis, but it is possible to perform the analysis process at a high speed (for example, 120 min) and with high analysis precision by using the analyzer according to this embodiment. Alternatively, some areas of the respective layers (for example, "501" in the drawing) may be selectively analyzed. In the analyzing method according to this embodiment, a semiconductor package (for example, BGA package) or the like may be analyzed. The inventor analyzed a ground plane for a BGA package using the analyzing method according to this embodiment.

It is also possible to manufacture an additionally designed circuit board by successively carrying out the circuit board designing method after carrying out the circuit board analyzing method according to this embodiment. The analyzing method according to this embodiment can be performed not only as a partial process of the circuit board designing method, but also as an independent process. In the typical circuit board designing method, basic specifications (function, performance, and the like) as an electronic apparatus are first determined, a circuit (logical circuit diagram) for embodying the specifications is prepared, the resultant logical circuit diagram is repeatedly simulated, the layout including actual elements and wiring patterns is designed by the use of the CAD when there is no problem in the logical circuit diagram, and then a mask is prepared. The analyzing method according to this embodiment can be carried out as one step in designing the layout. It is also possible to manufacture a circuit board using the mask prepared by the designing method including the analyzing method according to this embodiment.

The exemplary embodiments of the invention have been hitherto described. As long as the elements (RLGC) having an influence on the wiring interference can be specified before the analysis process and some of the elements can be ignored to perform the analysis process, the invention is not limited to the embodiments, but can be modified in various forms. For example, in the above-mentioned embodiment, the equivalent circuit model is constructed to specify the elements on the basis of the setting condition J of the cells and branches. However, as long as the elements having an influence on the wiring interference can be specified, the invention is not limited to the equivalent circuit model based on the setting condition J, but other setting conditions may be given to the cells and the branches to construct other equivalent circuit models.

Any other step may be added to the above-mentioned circuit board analyzing flow. For example, at the time of analyzing a module or the like, another S parameter or another circuit may be connected to display the characteristics after outputting the S parameter shown in FIG. 12.

In the above-mentioned embodiment, the circuit board to be analyzed is the printed circuit board, but is not limited to the printed circuit board. The analysis method according to the invention can be applied to various circuit boards such as a component-built-in board and a semiconductor integrated circuit board.

In the above-mentioned embodiment, the configuration that the computer 100 prepares the wiring data 200 is employed. However, a configuration that all or a part of the wiring data 200 is prepared by another computer and the circuit board is analyzed using the data may be employed. In this configuration, for example, a database of components prepared by a component maker can be used and the circuit board can be analyzed using the prepared data at the time of changing some design of the circuit board, thereby reducing the labor in board design.

Regarding the computer 100, the interference analysis program 300 is executed to analyze the circuit board by the computer 100 used by the designer of the board, but the invention may be embodied by combination of different computers. For example, the wiring data 200 and the like is transmitted from a first computer to a second computer through a network and data (for example, a net list including extracted element values) obtained by analyzing the circuit board is transmitted from the second computer to the first computer. According to this configuration, by only providing the first computer with a part of the interference analysis program 300, for example, a module for inputting data or displaying the analysis result, the invention can be used.

In the above-mentioned embodiment, the analysis of the circuit board, that is, the printed circuit board, is described. However, the invention is not limited to the circuit board, but can be applied to the layout of elements or the wiring of a semiconductor integrated circuit (LSI) to improve both the analysis speed and the analysis precision. The LSI can be analyzed in the same way as the circuit board.

Industrial Applicability

According to the above-mentioned invention, it is possible to provide a circuit board analyzing method and a circuit board analyzer that can greatly reduce the analyzing time.

The invention claimed is:

1. An analyzing device for a circuit device, comprising:
a computing unit which computes a coupling state between elements of the circuit device;
a memory unit connected to the computing unit; and
an input unit connected to the computing unit,
wherein the computing unit includes:
a division section dividing the circuit device into a plurality of areas on a basis of layout data of the circuit device; and
a coupling ignoring section performing a setting operation of ignoring a coupling between the areas divided by the division section.

2. The analyzing device according to claim 1, wherein the computing unit further includes:
a coupling specifying section (a) specifying a coupling occurrence position in the layout of the circuit device; and
a coupling ignoring section (b) performing a setting operation of ignoring the coupling in the coupling occurrence position.

3. The analyzing device according to claim 2, wherein the division section divides a wiring area of the circuit device into meshes and gives a determinant to the meshes to form a determinant; and
wherein the coupling ignoring section (b) replaces at least a part of off-diagonal elements of the determinant with 0.

4. The analyzing device according to claim 3, wherein the coupling ignoring section (b) has a function of setting a coupling ignoring range on a basis of a minimum distance between the meshes.

5. The analyzing device according to claim 2, wherein the coupling specifying section (a) has a function of displaying mutual inductance and capacitance as circuit constants at a layout level.

6. The analyzing device according to claim 2, wherein the coupling specifying section (a) has a function of forming an equivalent circuit model on a basis of the layout of the circuit device.

7. The analyzing device according to claim 1, wherein the memory unit stores layout data based on the layout of the circuit device.

8. The analyzing device according to claim 1, wherein the division section further includes:
a wiring data acquiring section (a) acquiring data of wirings formed in the circuit device; and
a basic circuit diagram forming section (b) dividing the wirings into meshes and setting cells and branches connecting adjacent cells; and
wherein the coupling ignoring section includes an interference analysis setting section (c) setting an element ignoring range of elements set in the cells, between the cells, in the branches, and between the branches.

9. The analyzing device according to claim 8, wherein the coupling ignoring section further includes:
an element ignoring section (d) ignoring the elements on a basis of the setting of the element ignoring range; and
a circuit constant deriving section (e) deriving element values corresponding to circuit constants of the elements set in the cells, between the cells, in the branches, and between the branches.

10. The analyzing device according to claim 9, further comprising:
a circuit analyzing section which computes a circuit matrix using the element values derived by the circuit constant deriving section (d).

11. The analyzing device according to claim 10, wherein the circuit matrix is an S matrix.

12. The analyzing device according to claim 8, wherein the basic circuit diagram forming section (b) has: as the elements,
a function of setting serial resistance and inductance in the branches,
a function of setting mutual inductance between the branches,
a function of setting capacitance and conductance in the cells with respect to a ground, and
a function of setting capacitance and conductance between the cells.

13. The analyzing device according to claim 8, wherein the interference analysis setting section (c) further sets the element ignoring range of the elements set between the cells and between the branches on a basis of distances between the cells.

14. The analyzing device according to claim 8, wherein the interference analysis setting section (c) further sets the element ignoring range on a basis of element values corresponding to circuit constants of the elements set between the cells and between the branches.

15. The analyzing device according to claim 8, wherein the interference analysis setting section (c) further sets the element ignoring range on a basis of element values corresponding to circuit constants of the elements set in the cells and the branches.

16. The analyzing device according to claim 8, wherein the cells include ports for inputting and outputting an external signal.

17. The analyzing device according to claim 8, wherein the interference analysis setting section (c) further sets the range in response to an input from the input unit.

18. The analyzing device according to claim 8, wherein the interference analysis setting section (c) has a probing function of selecting as an analysis target area at least a part of an area including the wirings of the circuit device.

19. A circuit device analyzing method of analyzing a layout of a circuit device using an analyzing device including:
a computing unit having:
a division section,
a coupling specifying section (a), and
a coupling ignoring section (b),
a memory unit connected to the computing unit, and
an input unit connected to the computing unit, the method comprising:
the computing unit computing a coupling state between elements of the circuit device;
the division section dividing the circuit device into a plurality of areas in layout data of the circuit device;
the coupling ignoring section performing a setting operation of ignoring a coupling between the areas divided by the division section;
the coupling specifying section (a) performing a coupling specifying step of specifying a coupling occurrence position in a layout of the circuit device by the computing unit; and
the coupling ignoring section (b) performing a coupling ignoring step of performing a setting operation of ignoring the coupling in the coupling occurrence position.

20. The circuit device analyzing method according to claim 19, wherein the computing unit is connected to the input unit; and
wherein a coupling ignoring range is set in response to an input from the input unit in the coupling ignoring step.

21. A circuit device analyzing method of analyzing a layout of a circuit device using an analyzing device including:
a computing unit computing a coupling state between elements of the circuit device and having:
a division section dividing the circuit device into a plurality of areas in layout data of the circuit device, a coupling ignoring section performing a setting operation of ignoring a coupling between the areas divided by the division section,
a coupling specifying section (a), and
a coupling ignoring section (b),
a memory unit connected to the computing unit, and
an input unit connected to the computing unit, the method comprising:
the coupling specifying section (a) performing a coupling specifying step of specifying a coupling occurrence position in a layout of the circuit device by the computing unit; and
the coupling ignoring section (b) performing a coupling ignoring step of performing a setting operation of ignoring the coupling in the coupling occurrence position,
wherein the coupling specifying step further includes:
a wiring data acquiring step of acquiring data of the wirings formed in the circuit device; and
a basic circuit diagram forming step of dividing the wirings into meshes and setting cells and branches connecting adjacent cells; and
wherein the coupling ignoring step further includes:
an interference analysis setting step of setting an element ignoring range of elements set in the cells, between the cells, in branches, and between the branches;
a first element ignoring step of ignoring the elements on a basis of the setting of the element ignoring range; and
a circuit constant deriving step of deriving element values corresponding to circuit constants of the elements set in the cells and in the branches.

22. The circuit device analyzing method according to claim 21, wherein the wiring data acquiring step includes a step of acquiring the layout data from the memory unit storing the layout data based on the layout of the circuit device.

23. The circuit device analyzing method according to claim 21, wherein the interference analysis setting step includes a step of selecting as an analysis target area a part of an area including the wirings of the circuit device.

24. The circuit device analyzing method according to claim 21, wherein the element ignoring range is set on a basis of at least one of a minimum distance between the meshes and an element value.

25. The circuit device analyzing method according to claim 21, wherein the first element ignoring step includes a step of determining whether a distance between the cells is in the element ignoring range.

26. The circuit device analyzing method according to claim 21, further comprising a second element ignoring step of performing an element ignoring operation on a basis of the setting of the element ignoring range, after the circuit constant deriving step is conducted.

27. The circuit device analyzing method according to claim 26, wherein the second element ignoring step includes a step of determining whether the element value derived in the circuit constant deriving step is in the element ignoring range.

28. The circuit device analyzing method according to claim 27, further comprising a step of storing the element value derived in the circuit constant deriving step in the memory unit.

29. The circuit device analyzing method according to claim 26, further comprising a circuit analyzing step of computing a circuit matrix using the element values, after the second element ignoring step is conducted.

30. A non-transitory computer readable medium comprising an analyzing program for analyzing a wiring layout of a circuit device, wherein the program when executed by a computing unit, causes the computing unit to perform the circuit device analyzing method of claim 19.

31. The non-transitory computer readable medium according to claim 30, further causing the computing unit to execute:

a wiring data acquiring function of acquiring data, which is stored in the memory unit, of the wirings formed in the circuit device;

a basic circuit diagram forming function of dividing the wirings into meshes and setting cells and branches connecting adjacent cells;

an interference analysis setting function of setting an element ignoring range of elements set in the cells, between the cells, in branches, and between the branches;

an element ignoring function of ignoring the elements on a basis of the setting of the element ignoring range; and a circuit constant deriving function of deriving element values corresponding to circuit constants of the elements set in the cells, between the cells, in the branches, and between the branches.

\* \* \* \* \*